(12) United States Patent
Takamine

(10) Patent No.: US 6,753,641 B2
(45) Date of Patent: Jun. 22, 2004

(54) SURFACE ACOUSTIC WAVE DEVICE AND COMMUNICATION DEVICE

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 220 days.

(21) Appl. No.: 10/050,923

(22) Filed: Jan. 22, 2002

(65) Prior Publication Data

US 2002/0121842 A1 Sep. 5, 2002

(30) Foreign Application Priority Data

Mar. 1, 2001 (JP) .......................................... 2001-057159
Aug. 29, 2001 (JP) .......................................... 2001-260127

(51) Int. Cl.[7] .............................................. H01L 41/08
(52) U.S. Cl. ................................ 310/313 B; 310/313 D
(58) Field of Search .......................... 310/313 R, 313 D, 310/313 B, 313 A; 333/193–196

(56) References Cited

U.S. PATENT DOCUMENTS

| | | | | |
|---|---|---|---|---|
| 5,568,002 A | * | 10/1996 | Kawakatsu et al. | 310/313 B |
| 5,585,684 A | * | 12/1996 | Abe | 310/313 A |
| 5,949,383 A | | 9/1999 | Hayes et al. | |
| 6,081,172 A | * | 6/2000 | Strauss et al. | 333/193 |
| 6,166,611 A | | 12/2000 | Seki et al. | |
| 6,255,915 B1 | * | 7/2001 | Edmonson | 333/193 |
| 6,483,402 B2 | * | 11/2002 | Endoh et al. | 333/193 |
| 6,556,100 B2 | * | 4/2003 | Takamine | 333/193 |

FOREIGN PATENT DOCUMENTS

| | | |
|---|---|---|
| JP | 10-135780 | 5/1998 |
| JP | 2001-521311 | 11/2001 |

* cited by examiner

Primary Examiner—Mark Budd
(74) Attorney, Agent, or Firm—Keating & Bennett, LLP

(57) ABSTRACT

A surface acoustic wave device includes interdigital electrodes for generating a surface acoustic wave and detecting the wave, which are provided on a piezoelectric substrate having piezoelectric properties. A signal line is arranged so as to be connected to the interdigital electrodes which are unbalanced-side electrodes. Balanced-signal terminals are arranged so as to be connected to the interdigital electrode which is a balanced-side electrode. A ground line is provided between a balanced-signal terminal and the adjacent signal line. A capacitance generated between the signal line and the balanced-signal terminal is minimized by the ground line. Thus, the balance degrees between the balanced-signal terminals are greatly improved.

21 Claims, 22 Drawing Sheets

Related Art Example

SURFACE ACOUSTIC WAVE DEVICE AND COMMUNICATION DEVICE

BACKGROUND OF THE INVENTION

1. Field of the Invention

The present invention relates to a surface acoustic wave device having a filter characteristic, especially, a balance-unbalance conversion function, and a communication device including such a novel surface acoustic wave device.

2. Description of the Related Art

In recent years, techniques for reducing the sizes and weights of portable telephones have remarkably progressed. In order to achieve such reduction in size and weight, composite elements each having a plurality of functions combined with each other have been developed in addition to reduction of the number and sizes of components. Under these circumstances, recently, surface acoustic wave filters having balance-unbalance conversion functions, namely, balum functions for use in the RF stages of portable telephones have been intensively studied. The GSM system (Global System for Mobile Communications) and other such telecommunications systems have been used.

When balanced lines such as a two parallel line feeder are connected directly to unbalanced lines such as a coaxial cable, undesirably, unbalanced currents flow, and the feeder itself acts as an antenna. Thus, the balun includes a circuit for preventing the unbalanced currents and matching the balanced and unbalanced lines with each other.

Some surface acoustic wave devices having the above-described balance-unbalance conversion functions have been the subject of recent patent applications. As a surface acoustic wave device which has a balance-unbalance conversion function and of which the input and output impedances are substantially equal to each other, a device having the configuration shown in FIG. 20 is widely known.

In the surface acoustic wave device shown in FIG. 20, a comb-like electrode (also called an interdigital electrode, defining an Inter-Digital Transducer which is hereinafter referred to as "IDT") 101 is provided on a piezoelectric substrate 100, and IDTs 102 and 103 arranged on the right and left sides (in the surface acoustic wave propagation direction) of the IDT 101.

Moreover, in the aforementioned surface acoustic wave device, reflectors 104 and 105 for reflecting a surface acoustic wave to enhance the conversion efficiency are arranged so as to sandwich the IDTs 101, 102, and 103 from the right and left sides thereof. Moreover, balanced-signal terminals 106 and 107, and an unbalanced signal terminal 108 are provided.

The above-described surface acoustic wave device is called a longitudinally-coupled resonator type surface acoustic wave device of a 3-IDT type. The device has a balance-unbalance conversion function by which a surface acoustic wave is converted between the IDTs 101, 102, and 103.

The surface acoustic wave device having a balance-unbalance conversion function is required to have the following transmission characteristics in the pass-band between the unbalanced-signal terminal and the respective balanced-signal terminals: the amplitude characteristics are the same and the phases are inverted with respect to each other by 180°. These characteristics are represented by the amplitude-balance-degree and the phase-balance-degree between the balanced-signal terminals, respectively.

The above-described surface acoustic wave device having a balance-unbalance conversion function is assumed to be a three-port device. The unbalanced-input terminal is a first port, and the balanced-output terminals are the second and third ports. The amplitude-balance-degree and the phase-balance-degree are defined as follows: Amplitude-balance-degree=$[A]$. $A=[20\log(S21)]-[20\log(S31)]$, phase-balance-degree=$[B-180]$, $B=[ZS21-ZS31]$. S21 represents the coefficient of transfer from a first port to the second port, and S31 represents the coefficient of transfer from the first port to the third port. The symbol of $[\ ]$ in the aforementioned formulae represents an absolute value.

Referring to the balance degrees between signals at the aforementioned balanced-signal terminals, ideally, the amplitude-balance-degree in the transmission band of the surface acoustic wave device is 0 dB, and the phase-balance-degree is 0 degrees.

However, in the configuration of the related art shown in FIG. 20, a problem arises in that the balance degrees between the balanced-signal terminals are deteriorated. Several reasons for this deterioration are speculated. The inventor of the present invention discovered that a capacitance generated between the balanced-signal terminal 106 and the signal line 109, which is a bridging capacitance and is present in the vicinity of the balanced-signal terminal 106, is one of the greatest causes for the deterioration.

Hereinafter, the deterioration of the balance degrees between the balanced-signal terminals, caused by the generation of the bridging capacitance, will be described with reference to FIGS. 21 and 22. The respective characteristics of transmission from the unbalanced-signal terminal 108 to the respective balanced-signal terminals 106 and 107 were excluded from the matching impedance and identified by simulation, and the positions of the resonant modes were examined. FIGS. 21 and 22 show the results.

No bridging capacitance is assumed to be added between the balanced-signal terminal 106 and the signal line 109 in FIG. 20. Then, FIG. 21 shows the difference between the resonant mode of a signal transmitted from the unbalanced-signal terminal 108 to the balanced-signal terminal 106 and that of the signal transmitted from the unbalanced-signal terminal 108 to the balanced-signal terminal 107. FIG. 22 is a graph showing the difference between the resonant modes occurring when a bridging capacitance of 0.30 pF is assumed to be added between the balanced-signal terminal 106 and the signal line 109. In FIGS. 21 and 22, the solid lines represent the characteristics of transmission from the unbalanced-signal terminal 108 to the balanced-signal terminal 106, and the dotted lines represent the characteristics of transmission from the unbalanced-signal terminal 108 to the balanced-signal terminal 107.

Comparison of FIGS. 21 and 22 shows that when the bridging capacitance is added between the balanced-signal terminal 106 and the signal line 109, the difference between the resonant modes of signals at the balanced-signal terminals 106 and 107 which are two balanced-output terminals is larger.

It is generally known that in a longitudinally-coupled resonator type surface acoustic wave device, resonant modes having a phase difference of 180° are acoustically coupled to produce the characteristic of the device. In this case, the phases of the resonant modes seen from the balanced-signal terminal 106 side and those seen from the balanced-signal terminal 107 side are different by 180° in any case. This is simply expressed by symbols as follows. For example, when three resonant modes seen from the balanced-signal terminal

106 side are expressed by the symbols −, +, −, the three modes seen from the balanced-signal terminal 107 side are expressed by the symbols +, −, +.

When a bridging capacitance having a certain phase angle is added, the resonant mode of a transmission characteristic of a signal transmitted via the balanced-signal terminal 106 and that of the signal transmitted via the balanced-signal terminal 107 are influenced in completely opposite directions by the bridging capacitance, and the balance degrees between the balanced-signal terminals 106 and 107 are deteriorated.

The inventor of the present invention made various examinations including simulation. As a result, the inventor identified the cause for the deterioration of the balance degrees between signals the balanced-signal terminals 106 and 107.

SUMMARY OF THE INVENTION

In order to overcome the problems described above, preferred embodiments of the present invention provide a surface acoustic wave device in which a bridging capacitance, which is a main cause for deterioration of the balance degrees between the balanced-signal terminals of the surface acoustic wave device, is minimized such that the balance degrees between the balanced-signal terminals are greatly improved, and the balance degrees between the balanced-signal terminals are excellent, and the attenuation in the frequency range excluding the transmission band is high.

According to a first preferred embodiment of the present invention, a surface acoustic wave device includes a plurality of interdigital electrodes for converting an input signal to a surface acoustic wave which is to be output, the interdigital electrodes being arranged on a piezoelectric substrate in the surface acoustic wave propagation direction, a plurality of signal terminals including terminals for balanced-signals provided on the piezoelectric substrate, signal lines for connecting the signal terminals and the interdigital electrodes to each other, provided on the piezoelectric substrate, and a ground line provided between a signal terminal and an adjacent signal line on the piezoelectric substrate.

Preferably, in the surface acoustic wave device, the ground line is arranged to surround a signal line that has a pad shape.

In the above-described configuration, a signal input to an IDT (or IDTs) via the signal lines generates a surface acoustic wave on the surface of the piezoelectric substrate, which is propagated and detected by the other IDTs to be output. Thus, the conversion function for the signal is carried out. Moreover, in the above-described configuration, a desired transmission band for a signal can be achieved by adjustment of the intervals between the electrode fingers of the respective IDTs and the number of the electrode fingers. Therefore, the filter function can be also carried out.

In the above-described configuration, a ground line is provided between a signal terminal and the adjacent signal line on the piezoelectric substrate. A bridging capacitance generated between the signal terminal and the signal line is minimized by the ground line. Thus, influences of the bridging capacitance on the signal terminals, especially on the balanced-signal terminals are minimized. That is, the signal propagation characteristic of the device is greatly improved.

Moreover, according to another preferred embodiment of the present invention, a surface acoustic wave device includes a plurality of interdigital electrodes for converting an input signal to a surface acoustic wave which is to be output, the interdigital electrodes being arranged on a piezoelectric substrate in the surface acoustic wave propagation direction, a plurality of signal terminals including terminals for balanced signals provided on the piezoelectric substrate, signal lines for connecting the signal terminals and the interdigital electrodes to each other, provided on the piezoelectric substrate, and a ground electrode finger provided in the outermost portion of at least one of two adjacent interdigital electrodes which is opposed to that of the other interdigital electrode in such a manner that the tip of the ground electrode finger extends in the interdigitation-span direction compared to the other electrode fingers of the interdigital electrode.

In the above-described configuration, since the ground electrode finger is provided on the piezoelectric substrate in such a manner that the tip of the ground electrode extends in the interdigitation-span direction, the ground electrode finger can be interposed between the signal terminal and the adjacent signal line.

Accordingly, in the above-described configuration, a bridging capacitance generated between the signal terminal and the adjacent signal line is minimized by the ground line. Thus, influences of the bridging capacitance on the signal terminals, especially on the balanced signal terminals are minimized. That is, the signal propagation characteristic of the device is greatly improved.

Furthermore, according to another preferred embodiment of the present invention, a surface acoustic wave device includes a plurality of interdigital electrodes for converting an input signal to a surface acoustic wave which is to be output, the interdigital electrodes being arranged on a piezoelectric substrate in the surface acoustic wave propagation direction, a plurality of signal terminals including terminals for balanced signals provided on the piezoelectric substrate, and signal lines for connecting the signal terminals and the interdigital electrodes to each other, provided on the piezoelectric substrate, the interdigital electrode connected to a signal line and an adjacent interdigital electrode being constructed such that the widths of the bus bars of the interdigital electrodes are reduced whereby the opposing portions of the interdigital electrodes are reduced in size as compared to the other interdigital electrodes.

In the above-described configuration, the interdigital electrode connected to a signal line and the adjacent interdigital electrode are constructed such that the widths of the bus bars of the interdigital electrodes are reduced whereby the opposing portions of the interdigital electrodes are reduced in size as compared to the other interdigital electrodes. Thus, a bridging capacitance between the IDTs is minimized, and influences of the bridging capacitance on the signal terminals, especially on the balanced-signal terminals are minimized. Thus, the signal propagation characteristic of the device is greatly improved.

In the surface acoustic wave device according to various preferred embodiments of the present invention, preferably, a surface acoustic wave resonator connected to an interdigital electrode may be provided on the piezoelectric substrate. In this configuration, the surface acoustic wave resonator is connected in series with the IDTs so as to overlap their anti-resonance points, whereby the attenuation characteristic of the device is greatly improved. Moreover, the surface acoustic wave resonator may be connected, e.g., in parallel to the IDTs so as to make the resonance point coincident with the attenuation point, whereby a steep attenuation incline can be obtained.

The above-described surface acoustic wave device may have a balance-unbalance conversion function. In this configuration, the difference between the resonant modes of signals at the balanced-signal terminals is minimized. Thus, the balance-unbalance conversion characteristic of the device is greatly improved, that is, the balance degrees between the balanced-signal terminals are highly satisfactory, and the attenuation occurring out of the transmission band becomes very large.

In the surface acoustic wave device, preferably, the number of electrode fingers of the IDT connected to a balanced-signal terminal is even. In this configuration, since the number of electrode fingers of the IDT connected to a balanced-signal terminal is even, the balance degrees between the balanced-signal terminals are greatly improved.

Other features, characteristics, elements, and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of the present invention will be described with reference to FIGS. 1 to 19.

Figure 1:
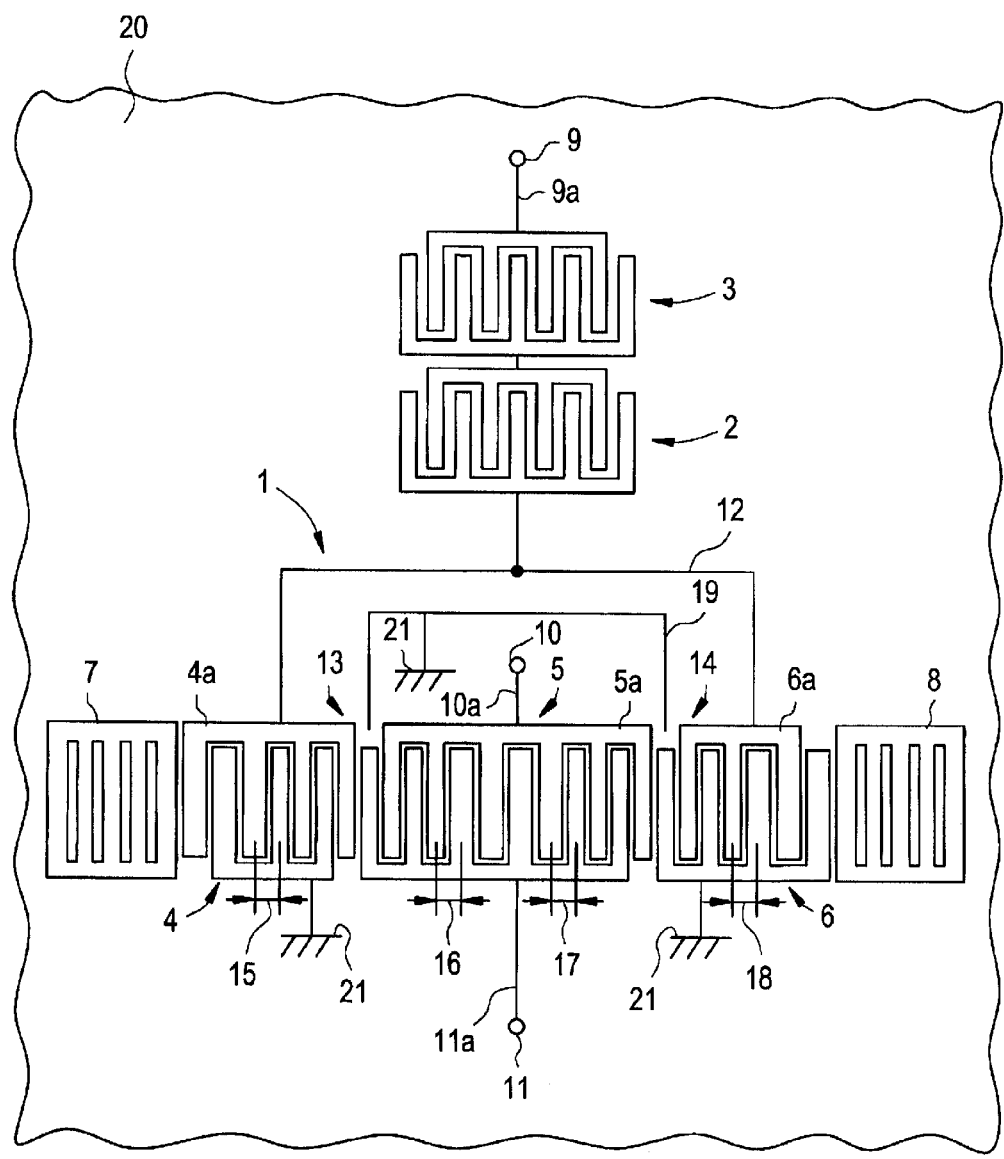
FIG. 1 is a schematic view of the configuration of a surface acoustic wave device according to a first preferred embodiment of the present invention.

FIG. 1 shows the configuration of a surface acoustic wave device according to a first preferred embodiment of the present invention. In respective preferred embodiments which will be described below, a reception filter for use in a PCS (Personal Communication System) will be described by way of an example, although other types of various filters are applicable to the present invention. As shown in FIG. 1, the surface acoustic wave device according to the first preferred embodiment of the present invention includes a longitudinally-coupled resonator type surface acoustic wave unit 1, and IDTs 2 and 3 as a surface acoustic wave resonator connected in series with the surface acoustic wave unit 1 which are provided on a piezoelectric substrate 20 made of, for example, 40±5° Y cut X propagation LiTaO$_3$. The piezoelectric substrate 20 may also be made of other suitable materials. The longitudinally-coupled resonator type surface acoustic wave unit 1 and the IDTs 2 and 3 are preferably made of aluminum (Al) electrodes (foils) which are formed by photolithography or other suitable process.

Each of the IDTs 2 and 3 preferably includes belt-shaped base-end portions and two electrode finger portions each having a plurality of electrode fingers extending from one side of the base-end portion in a direction that is substantially perpendicular to the one side of the base end portion and being substantially parallel to each other. The electrode fingers in the respective electrode finger portions are interdigitated with each other in such a manner that the sides of the electrode fingers in one electrode finger portion face those in the other electrode finger portions, respectively.

The signal conversion characteristics and the transmission bands of the IDTs 2 and 3 can be set by adjusting the lengths and widths of the electrode fingers, the intervals between adjacent electrode fingers, and the interdigitation-spans of the electrode fingers, which mean the lengths over which the interdigitated electrode fingers face each other, respectively. Moreover, the other IDTS, which will be described later, have configurations and functions similar to those of the IDTs 2 and 3, respectively.

In the longitudinally-coupled resonator type surface acoustic wave unit 1, an IDT 5 for balanced-signals is provided. Moreover, IDTs 4 and 6 for unbalanced signals are arranged so as to sandwich the IDT 5 from the right and left sides (in the direction in which a surface acoustic wave is propagated). Reflectors 7 and 8 are disposed on both of the outer sides (in the surface acoustic wave propagation direction) of the IDTs 4 and 6. The reflectors 7 and 8 have a function of reflecting a propagated surface acoustic wave.

The pitches of several electrode fingers (narrow pitch electrode fingers) between the IDTs 4 and 5 and those (narrow pitch electrode fingers) between the IDTs 5 and 6 preferably smaller than those of the other electrode fingers of these IDTs (in portions 13 and 14 shown in FIG. 1), and the insertion losses are thereby reduced. Two terminals (connection portions) 10 and 11 for balanced signals are connected to the IDT 5 via signal lines 10a and 11a, respectively. A terminal (connection portion) 9 for unbalanced signals is connected to one electrode finger portion of each of the IDTs 4 and 6 via IDTs 2, 3 and signal line 9a. The other electrode finger portions of the IDTs 4 and 6 are connected to grounds 21, respectively.

A signal line (connection portion) 12 is arranged so as to connect the IDT 2 to the IDTs 4 and 6. Thus, the signal line 12 faces the balanced-signal terminal 10, one of the two balanced-signal terminals 10 and 11, surrounding the terminal 10. The IDTs 2 and 3 are connected in series with each other between the unbalanced signal terminal 9 and the IDTs 4 and 6. It should be noted that the number of the electrode fingers shown FIG. 1 is reduced for simple illustration.

Hereinafter, details of the longitudinally-coupled resonator type surface acoustic wave unit 1 are described by way of an example. In this description, $\lambda I_2$ is a wavelength determined by the pitch of the narrow pitch electrode fingers (in the portions 13 and 14 shown in FIG. 1), and $\lambda I_1$, is a wavelength determined by the pitch of the other electrode fingers. The features of this unit 1 are as follows:

interdigitation-span W is about 60.6 $\lambda I_1$.

Numbers of electrode fingers in the IDTs (in the order of the IDTs 4, 5, and 6): 33(4)/(4)52(4)/(4)33 (the numerical value in parentheses mean the number of electrode fingers having a reduced pitch, and the (4) in the expression of (4)52(4) means that the pitches of the four electrode fingers on each side in the surface acoustic wave propagation direction of fifty two electrode fingers are reduced, respectively).

wavelength $\lambda I_1$ in IDT: 2.06 μm, $\lambda I_2$: 1.88 μm wavelength $\lambda R$ in reflector: 2.07 μm number of electrode fingers in reflectors: 100 interval between IDT—IDT: 0.50 $\lambda I_2$ intervals between portions (indicated by the reference numerals 15, 16, 17, and 18 in FIG. 1) sandwiched by the electrode fingers presenting the wavelengths $\lambda I_1$ and $\lambda I_2$: 0.25$\lambda I_1$+0.25 $\lambda_2$ interval between IDT-reflector: 0.47 $\lambda R$ duty: 0.60 (IDT and also reflector)

film-thickness of electrode: 0.080 $I_1$

Details of the designed IDT 2 as a surface acoustic wave resonator are as follows.

interdigitation-span: 49.1 λ number of electrode fingers in IDT: 401 wavelength λ (for IDT and also reflector): 2.04 μm number of electrode fingers in reflector: 30 interval between IDT and reflector: 0.50 λ duty: 0.60 (for IDT and also reflector)

film-thickness of electrode: 0.080 λ

Details of the designed IDT 3 as a surface acoustic wave resonator are as follows.

interdigitation-span: 40.6 λ number of electrode fingers in IDT: 241 wavelength (for IDT and also reflector): 1.97 μm number of electrode fingers in reflector: 30 interval between IDT and reflector: 0.50 λ duty: 0.60 (for IDT and also reflector)

film-thickness of electrode: 0.084 λ

Each of the aforementioned intervals means the distance between the centers of adjacent electrode fingers.

In the first preferred embodiment, a ground line preferably made of an aluminum (Al) electrode (foil) is inserted between the signal line 12 and the balanced-signal terminal 10 on a piezoelectric substrate 20. Preferably, the ground line 19 is arranged so as to surround the balanced signal terminal 10 having a pad-like shape, that is, a substantially U-shaped configuration.

Moreover, for simple production, preferably, the ground line 19 is arranged so as to be located in the center between the signal line 12 and the balanced-signal terminal 10 (equal interval).

In FIG. 1, the ground line 19 is connected to a ground 21. The ground line 19 may be connected to the ground electrode finger portion connected to the ground 21 of at least one of the IDTs 4 and 6 while the aforementioned connection to the ground 21 is omitted. Moreover, the ground line 19 may be connected to the ground 21 on the back side of the piezoelectric substrate 20 via wire bonding or a through-hole passing through the piezoelectric substrate 20.

Figure 2:
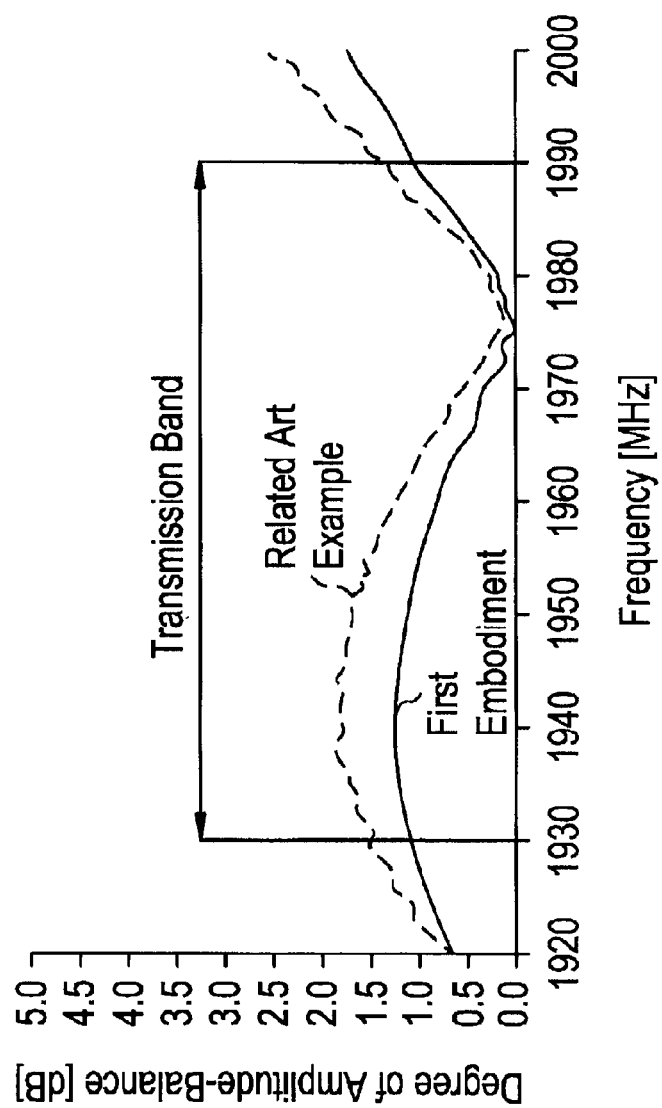
FIG. 2 is a graph showing the difference between the amplitude-balance-degree of the surface acoustic wave device of the first preferred embodiment of the present invention and that of the surface acoustic wave device as an example of the related art.

Hereinafter, the operation and effects of the ground line 19 which is arranged as described above will be described. FIG. 2 graphically shows the measurement results of the amplitude-balance-degree with respect to the frequency at the balanced-signal terminals 10 and 11 in the first preferred embodiment, while FIG. 3 graphically shows the measurement results of the phase-balance-degree with respect to the frequency.

Figure 3:
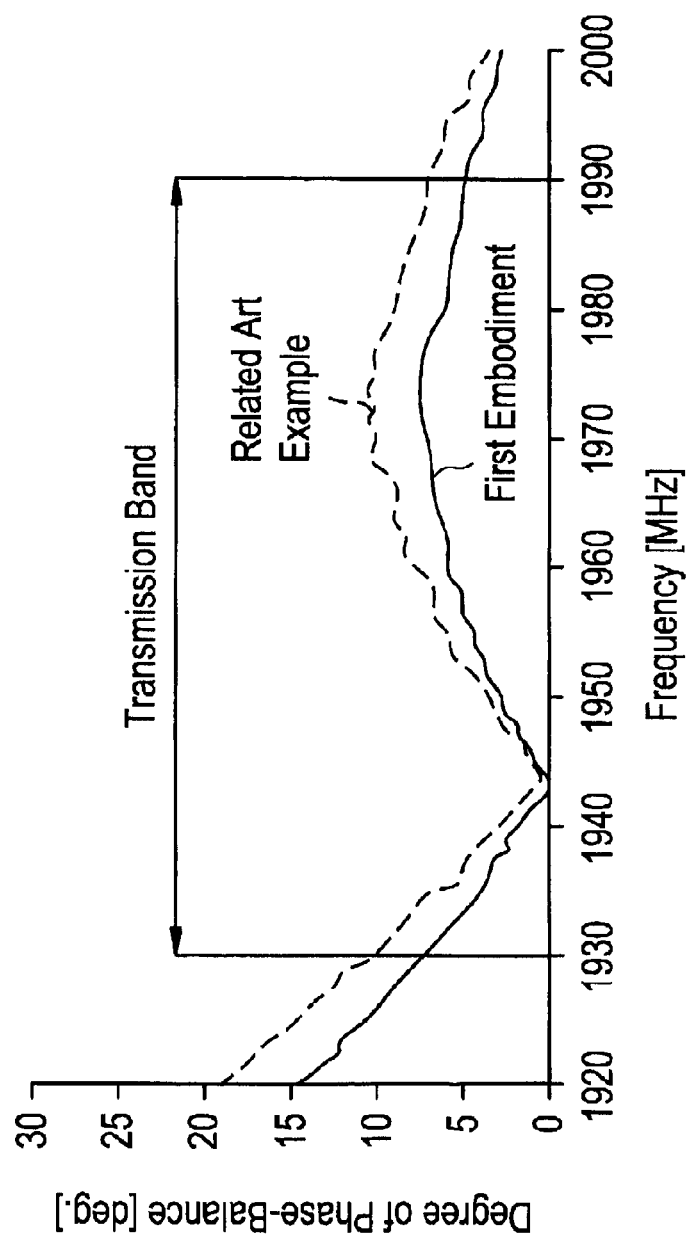
FIG. 3 is a graph showing the difference between the phase-balance-degree of the surface acoustic wave device according to the first preferred embodiment of the present invention and that of the surface acoustic wave device as an example of the related art.
Figure 4:
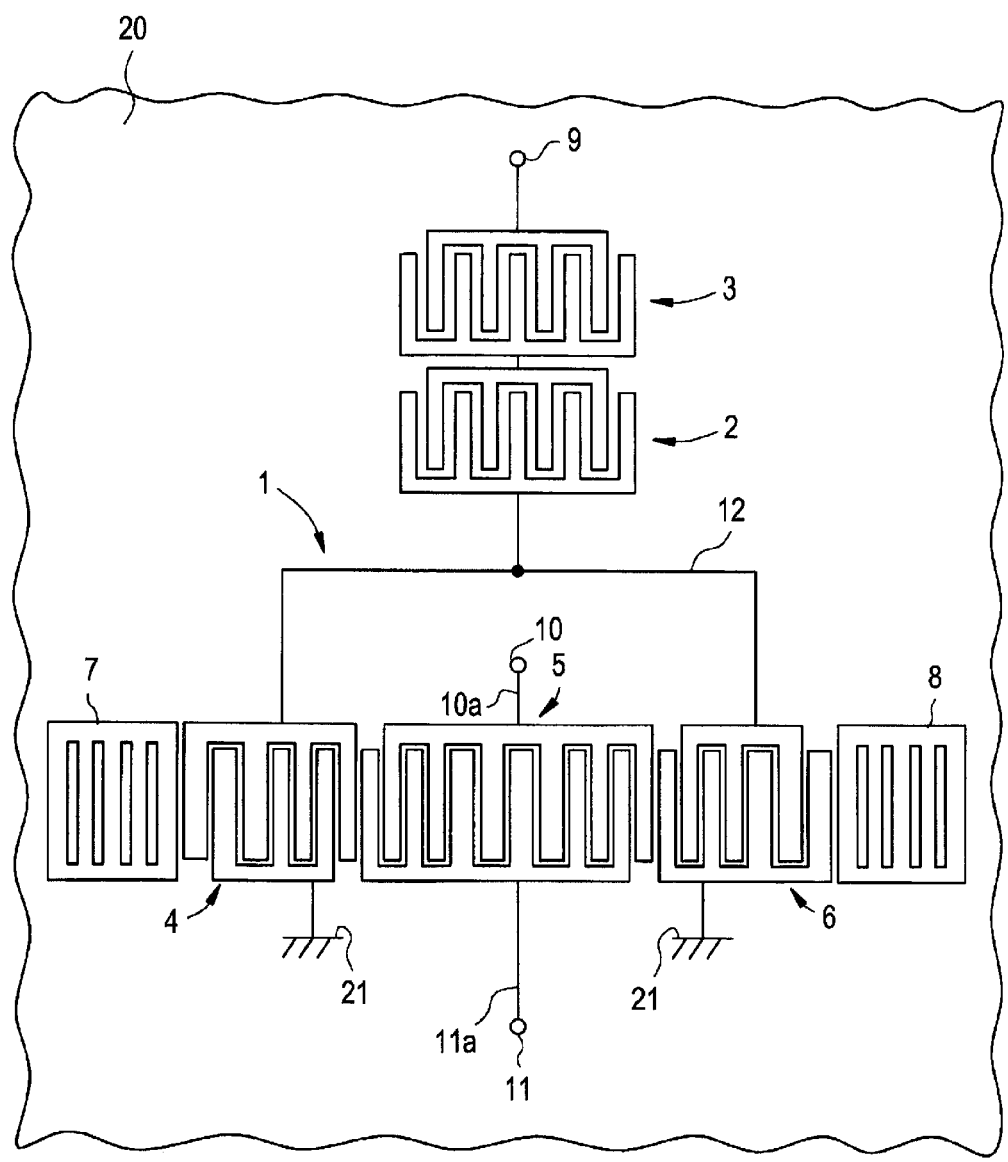
FIG. 4 is a schematic view of the configuration of the surface acoustic wave device as the example of the related art provided for comparison to the surface acoustic wave device of the first preferred embodiment of the present invention.

For comparison, FIGS. 2 and 3 also show the measurement results of the amplitude-balance-degree and the phase-balance-degree of an example of the related art having the configuration shown in FIG. 4 in which the ground line 19 is not provided between the signal line 12 and the balanced-signal terminal 10. The configuration of the related art example shown in FIG. 4 is the same as that of the first preferred embodiment, except that the ground line 19 is not inserted. The frequency range in the transmission band of the PCS reception filter used as a surface acoustic wave device is, e.g., from about 1930 MHz to about 1990 MHz.

Referring to the maximum shifts in the amplitude-balance-degrees in the aforementioned frequency range, the balance degree of the first preferred embodiment is about 1.3 dB, and that of the related art example is about 1.9 dB, as seen in the results of FIG. 2. Thus, the amplitude-balance-degree of the surface acoustic wave device according to the first preferred embodiment is improved approximately by about 0.6 dB compared to that of the related art example.

Referring to the phase-balance-degrees, the maximum shift is about 7.5 degrees for the first preferred embodiment, and is about 11.5 degrees for the related art example, as seen in the results of FIG. 3. Thus, the phase-balance-degree of the surface acoustic wave device according to the first preferred embodiment is improved by approximately 4 degrees.

These improvements are achieved to the shielding effect of the ground line 19 which is inserted between the signal line 12 and the balanced-signal terminal 10, which minimizes the bridging capacitance between the signal line 12 and the balanced signal terminal 10.

Figure 5:
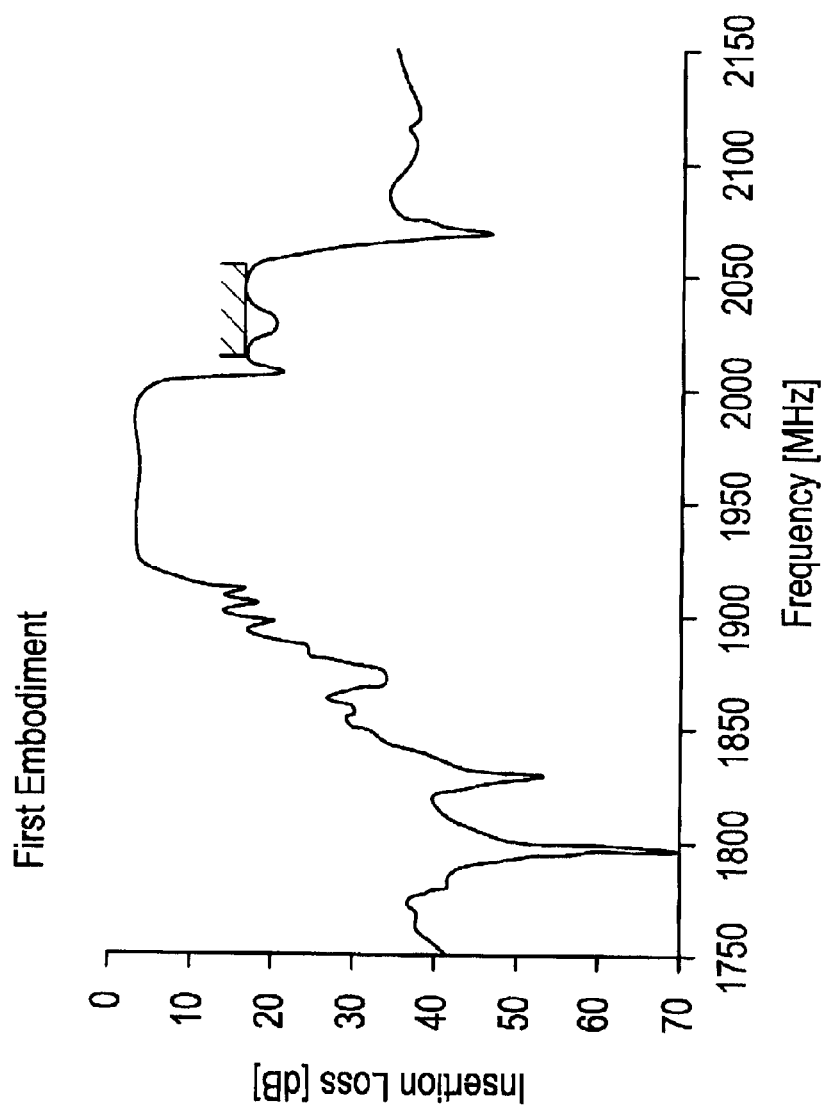
FIG. 5 is a graph showing the transmission versus frequency characteristic (narrow span) of the surface acoustic wave device according to the first preferred embodiment of the present invention.
Figure 6:
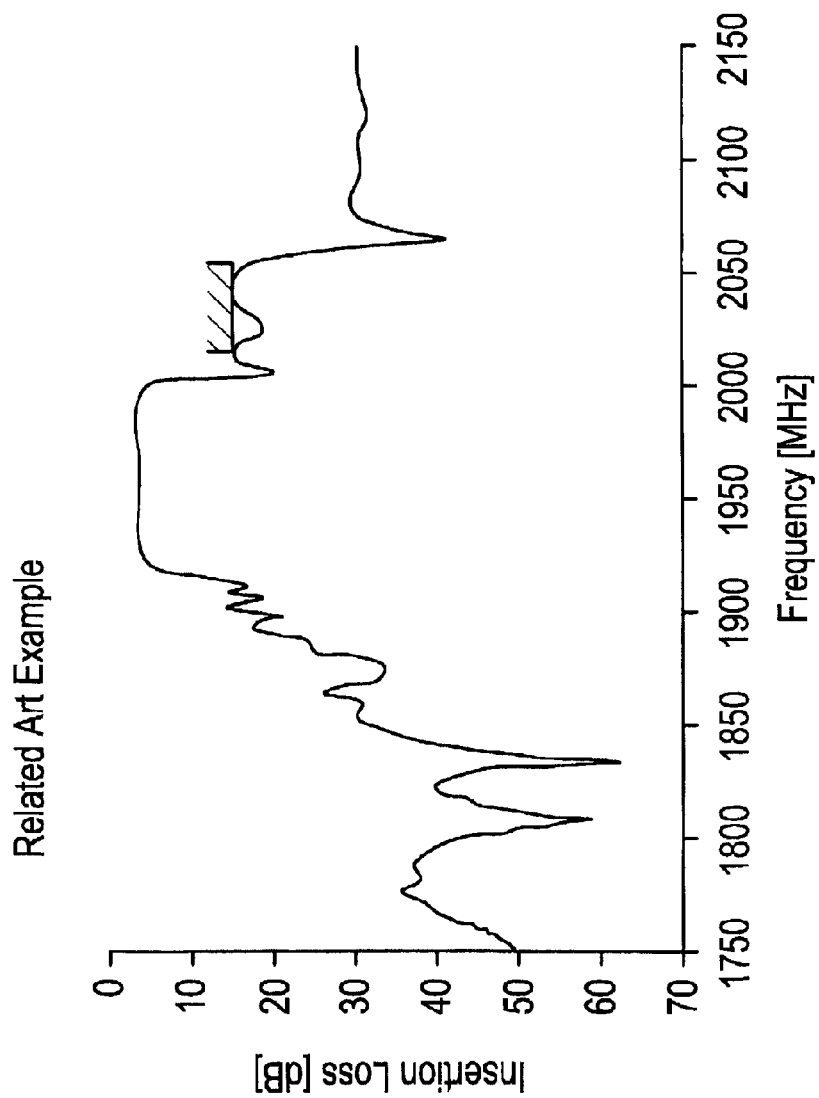
FIG. 6 is a graph showing the transmission versus frequency characteristic (narrow span) of the surface acoustic wave device of the related art example.
Figure 7:
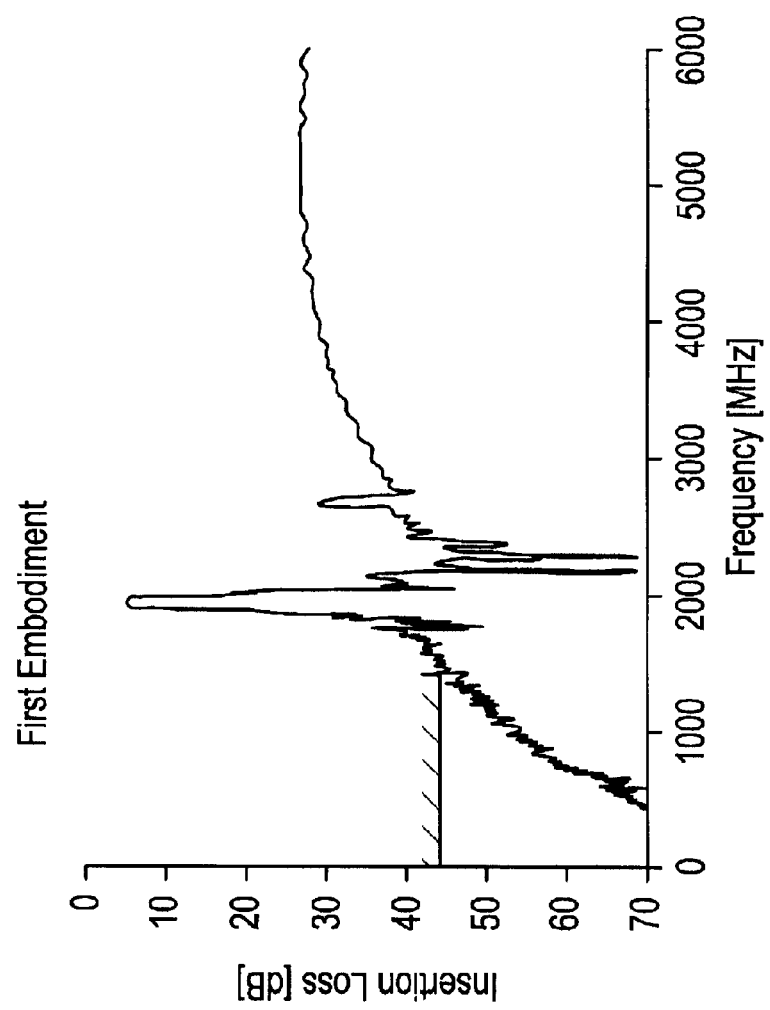
FIG. 7 is a graph showing the transmission versus frequency characteristic (wide span) of the surface acoustic wave device according to the first preferred embodiment of the present invention.
Figure 8:
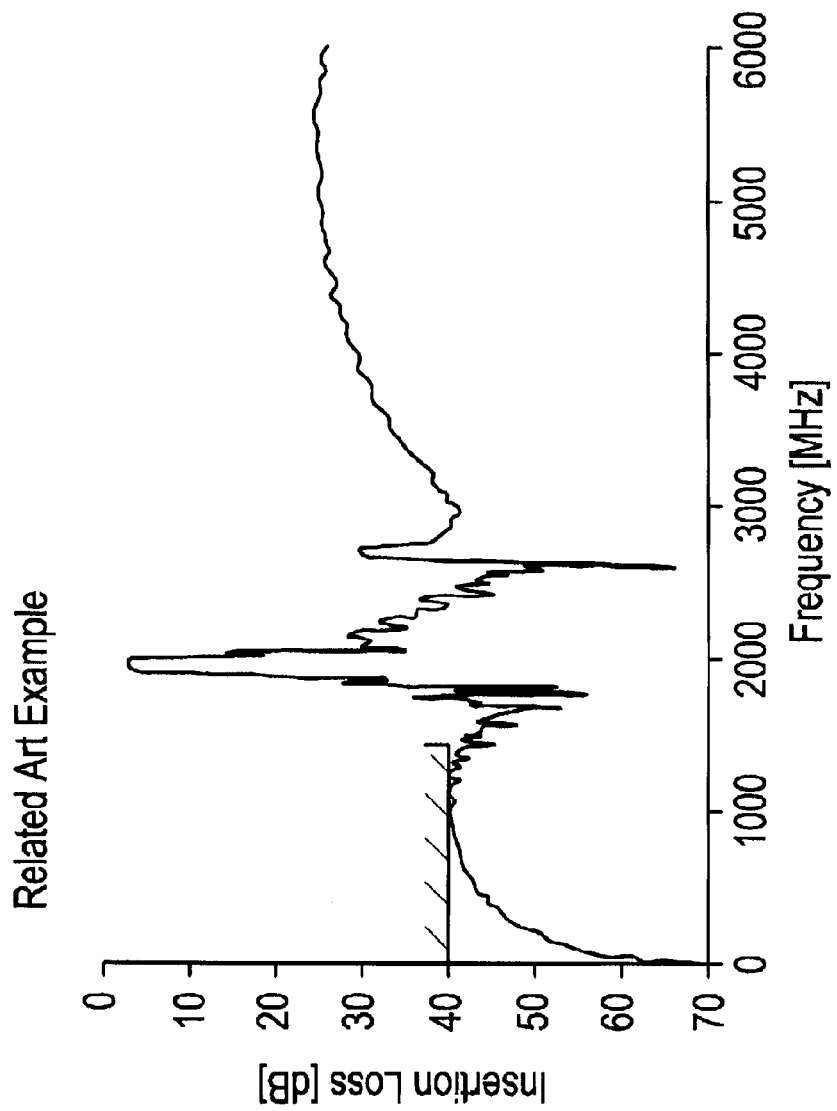
FIG. 8 is a graph showing the transmission versus frequency characteristic (wide span) of the surface acoustic wave device of the related art example.

Moreover, FIGS. 5 and 7 show the amplitude-frequency characteristic of the device having the configuration of the first preferred embodiment. FIGS. 6 and 8 show the amplitude-frequency characteristic of the example having the configuration of the related art, comparison of FIGS. 5 to 8 with each other reveals that the attenuation occurring out of the transmission band of the first preferred embodiment is significantly improved compared to that of the related art example. For example, when FIGS. 5 and 6 are compared to each other, it is found that the attenuation occurring in the neighborhood (about 2020 MHz to about 2060 MHz and its vicinity) of the transmission band on the higher frequency side of the device according to the first preferred embodiment of the present invention is improved by about 2 dB to about 3 dB compared to that of the related art example.

In filter devices having balanced-unbalanced conversion functions or balanced inputting-unbalanced outputting functions, if the balance degrees of a filter device are ideal, the attenuation occurring out of the transmission band of the filter device is infinite.

In the first preferred embodiment, the balance degrees between the balanced signal terminals 10 and 11 are improved compared to that of the related art example, and therefore, the attenuation occurring out of the transmission band is increased. Especially, the attenuation is improved in the lower frequency range (about 0 MHz to about 1500 MHz and its vicinity) with respect to the transmission band, and also, right in the vicinity (about 2020 MHz to about 2060 MHz and its vicinity) of the transmission band on the higher frequency side.

In many cases of mobile communication systems used in recent years, attenuation in the vicinity of a transmission band is required for various reasons. Therefore, the surface acoustic wave device obtained according to this preferred embodiment of the present invention is very suitable for use in the mobile communication systems, especially for such systems to operate in a frequency band higher than the GHz band.

Another preferred embodiment of the present invention will now be described. In the first preferred embodiment, the ground line 19 is inserted between the signal line 12 and the adjacent balanced signal terminal 10, and thereby, the bridging capacitance between them is minimized. In addition to the above-described site between the line 12 and the terminal 10, sites where signal lines (signal propagation lines) are adjacent to each other include, e.g., the bus bars 4a, 5a, and 6a of the respective IDTs 4, 5, and 6, and so forth. The bus bars 4a, 5a, and 6a of the IDTs 4, 5, and 6 are adjacent to each other on the side of the IDTs where they are connected to the signal lines, and therefore, large bridging capacitances are generated there.

Figure 9:
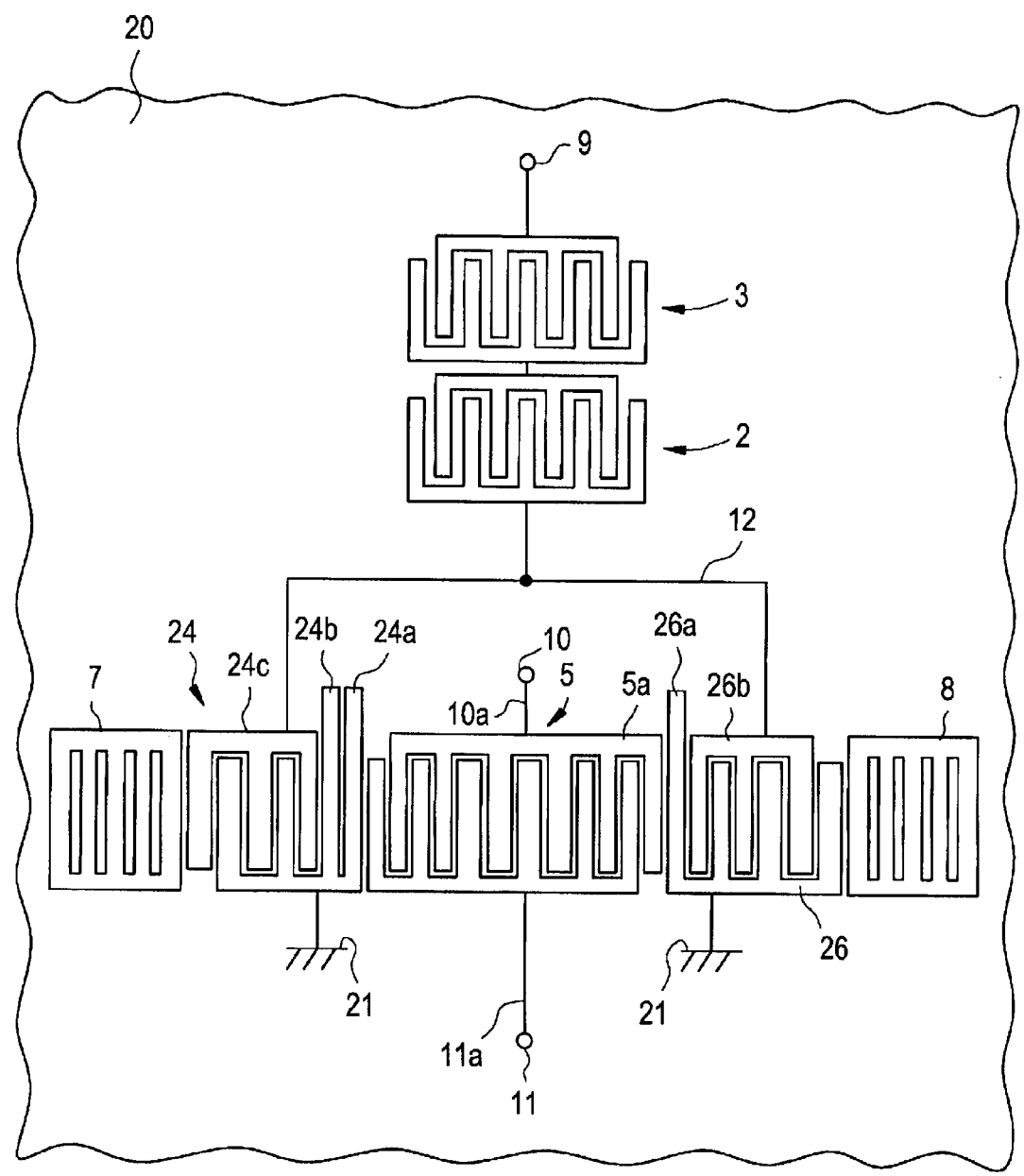
FIG. 9 is a schematic view of a surface acoustic wave device according to a second preferred embodiment of the present invention.

In the second preferred embodiment, to reduce the aforementioned bridging capacitances, the configuration as shown in FIG. 9 is provided by way of an example, in which the ground line 19 is omitted. The configuration of FIG. 9 is based on that of FIG. 4, and is provided with an IDT 24. The outermost electrode finger of the IDT 24 present in the site where the bus bars 4a and 5a are adjacent to each other as shown in FIG. 4 is removed as shown in FIG. 4.

Furthermore, the removed electrode finger 24a is connected to the ground 21 side in the IDT 24. Thus, the signal electrode fingers of the IDTs 5 and 24 are not adjacent to each other between the IDTs 5 and 24. In other words, an electrode finger 24a connected to the ground 21 is interposed between the IDTs 5 and 24.

Moreover, in the second preferred embodiment, the tip portions of the electrode fingers 24a, 24b, and 26a of the IDTs 24 and 26, which are connected to the ground 21, and are present in the sites where the IDTs 24, 5, and 26 are adjacent to each other, are extended in the interdigitation-width direction. Thus, the tip portions of the electrode fingers 24a, 24b, and 26a are inserted (interposed) between the bus bars 24c, 5a, and 26b.

Shielding effects can be obtained between adjacent signals lines 12, and between the signal lines 12 and the balanced signal terminal 10, due to the electrode fingers 24a, 24b, and 26a, similarly to the first preferred embodiment. Thus, bridging capacitances generated between are minimized, and the signal propagation characteristic of the device is also improved as described above. The configurations and the functions of the IDTs 24 and 26 are the same as those of the IDTs 4 and 6 except for the electrode fingers 24a, 24b, and 26a.

As described above, in the surface acoustic wave device having a balance-unbalance conversion function according to the first and second preferred embodiments, the adjacent signal lines 12, and also, the signal line 12 and the balanced-signal terminal 10 are shielded from each other by insertion or arrangement of the ground line 19 and the electrode fingers 24a, 24b, and 26a. Thus, a surface acoustic wave device having improved balance degrees between the balanced signal terminals 10 and 11 compared to the surface acoustic wave device of the related art can be provided.

In the first and second preferred embodiments, of the IDTs 4, 5, and 6 or the IDTs 24, 5, and 26, the number of all the electrode fingers in the IDT 5, which is in the center of the IDTs, is preferably even. The reason is that the numbers of the electrode fingers connected to the balanced-signal terminals 10 and 11, respectively, can be equal to each other, and thereby, more advantageously, according to preferred embodiments of the present invention, the balance degrees between the balanced signal terminals 10 and 11 are further improved.

The number of all the electrode fingers in the IDT 5 which is in the center of the IDTs is preferably even to further improve the balance degrees between the balanced signal terminals 10 and 11 similarly to the first preferred embodiment. However, the advantages of the present invention can be also obtained even if the number is odd.

Figure 10:
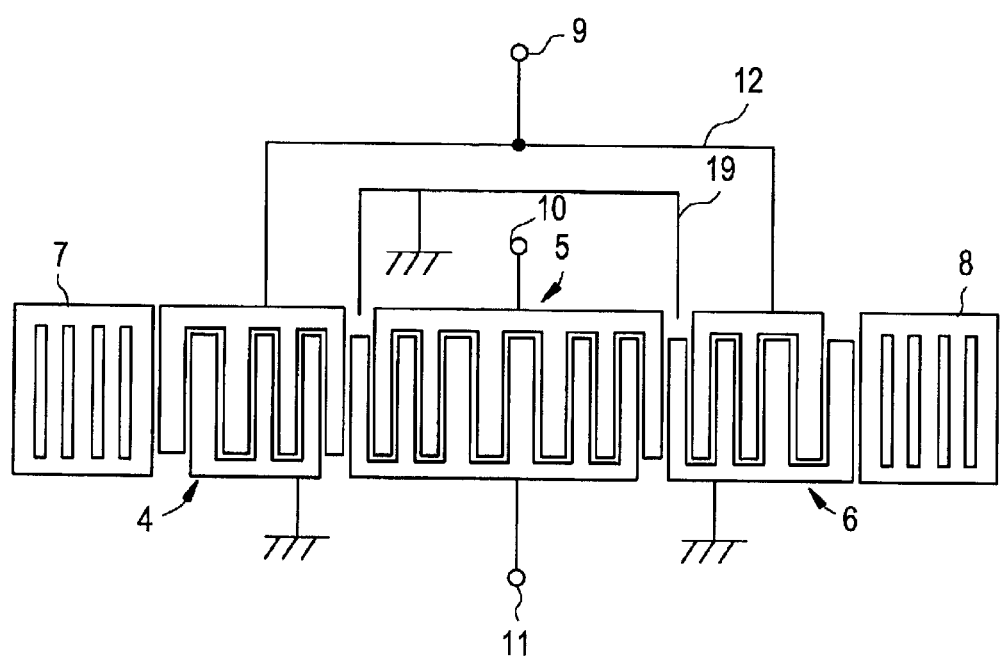
FIG. 10 is a schematic view of a surface acoustic wave device according to a third preferred embodiment of the present invention.

A further preferred embodiment of the present invention is now described. In the first and second preferred embodiments, the IDTs 2 and 3 as surface acoustic wave resonators are connected in series with the longitudinally-coupled resonator type surface acoustic wave unit 1. The purpose is so the attenuation on the high frequency side of the transmission band is increased. The configuration of the surface acoustic wave device according to the third preferred embodiment is preferably the same as that shown in FIG. 1 except that the IDTs 2 and 3 are omitted, as shown in FIG. 10. In this case, the advantages of the present invention can be also obtained.

As described above, in the configurations of the first and second preferred embodiments, the IDTs 2 and 3 as two surface acoustic wave resonators are connected in series with the longitudinally-coupled resonator type surface acoustic wave unit 1 which includes the three IDTs, and balanced signals are produced in the IDT 5 which is located in the approximate center of the longitudinally-coupled resonator type surface acoustic wave unit 1. The present invention is not limited to this configuration. The same advantages as described above can be obtained in surface acoustic wave devices having any configuration, provided that it includes signal terminals and signal lines.

Figure 11:
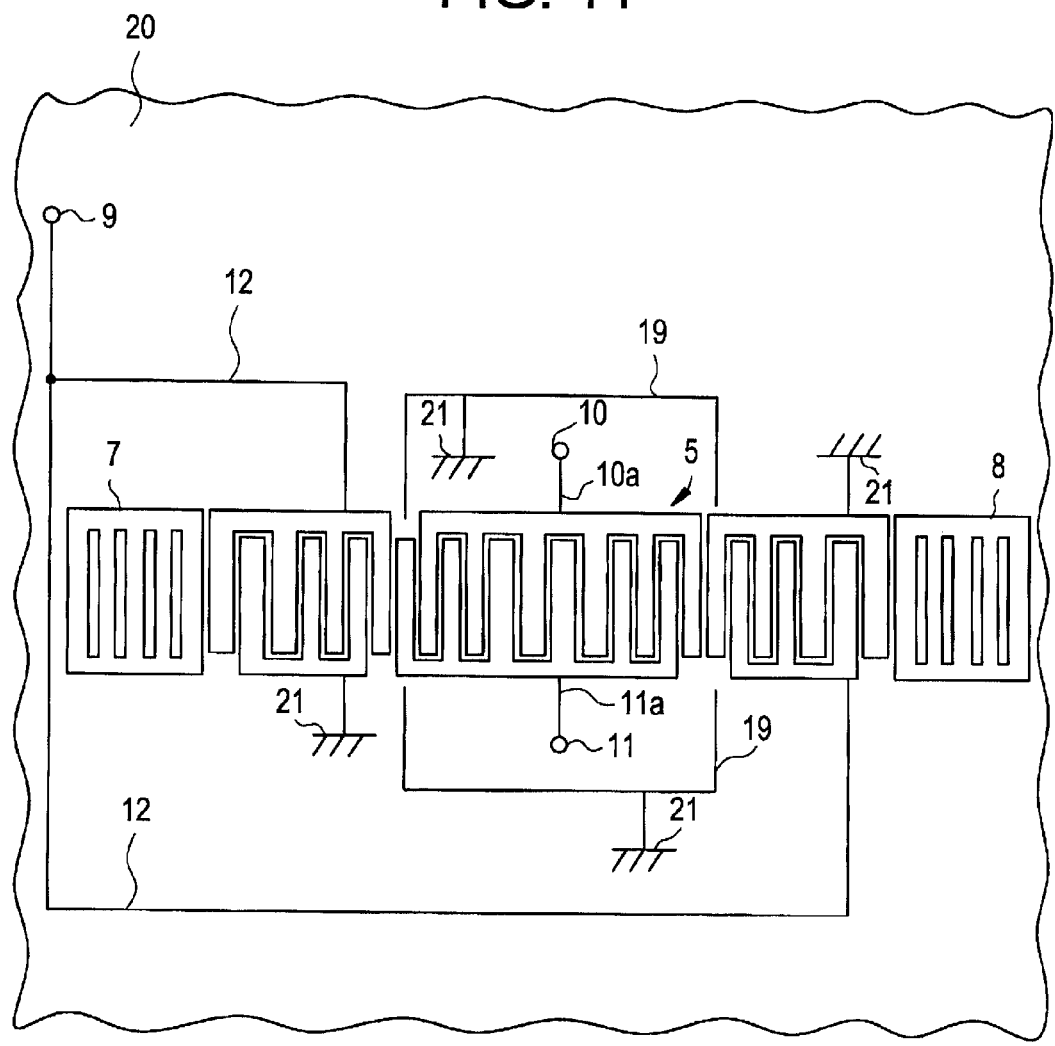
FIG. 11 is a schematic view of a modification of the surface acoustic wave device according to the third preferred embodiment, which is effective in reducing bridging capacitances.
Figure 12:
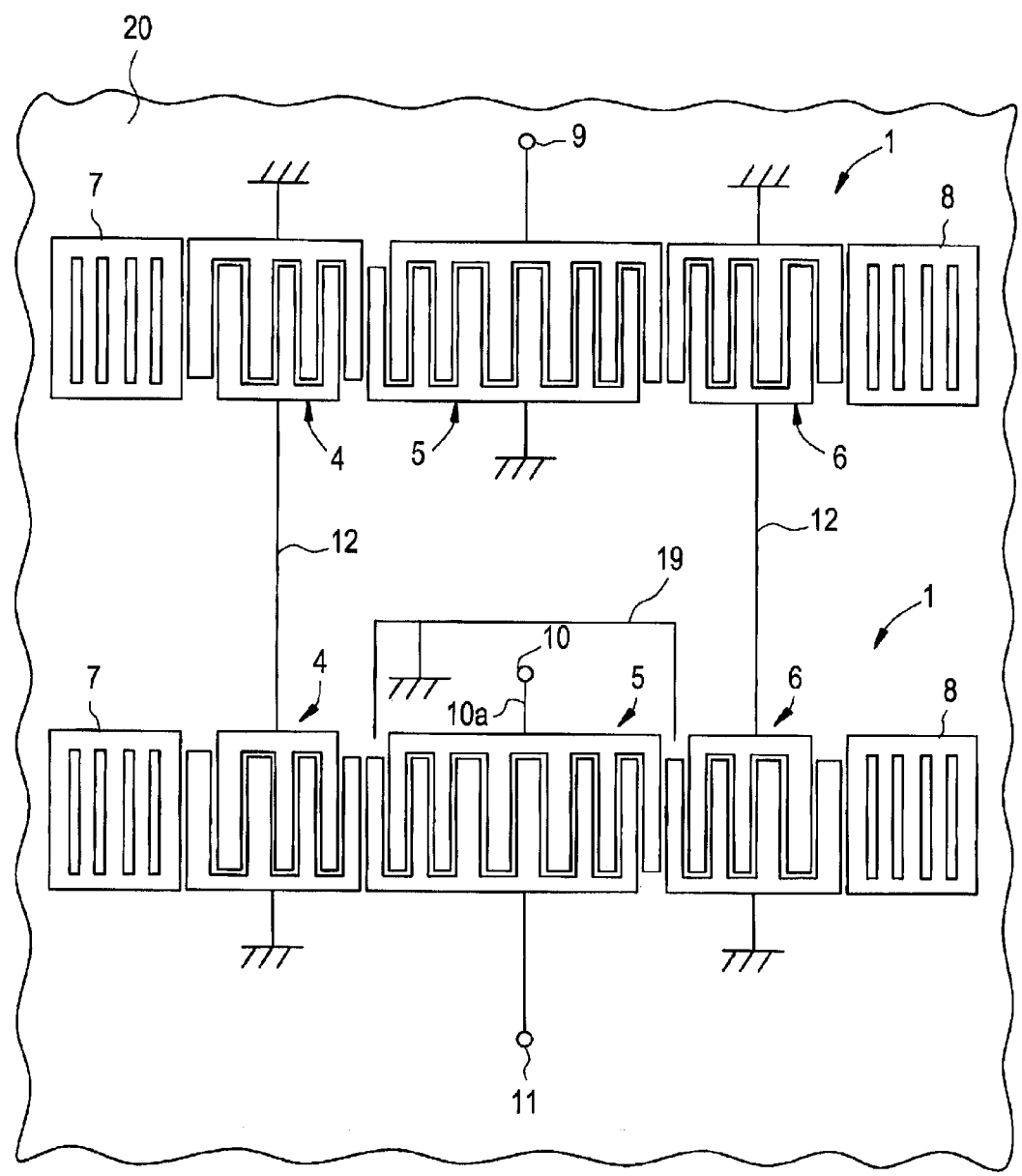
FIG. 12 is a schematic view of another modification of the surface acoustic wave device according to the third preferred embodiment, which is effective in reducing bridging capacitances.
Figure 13:
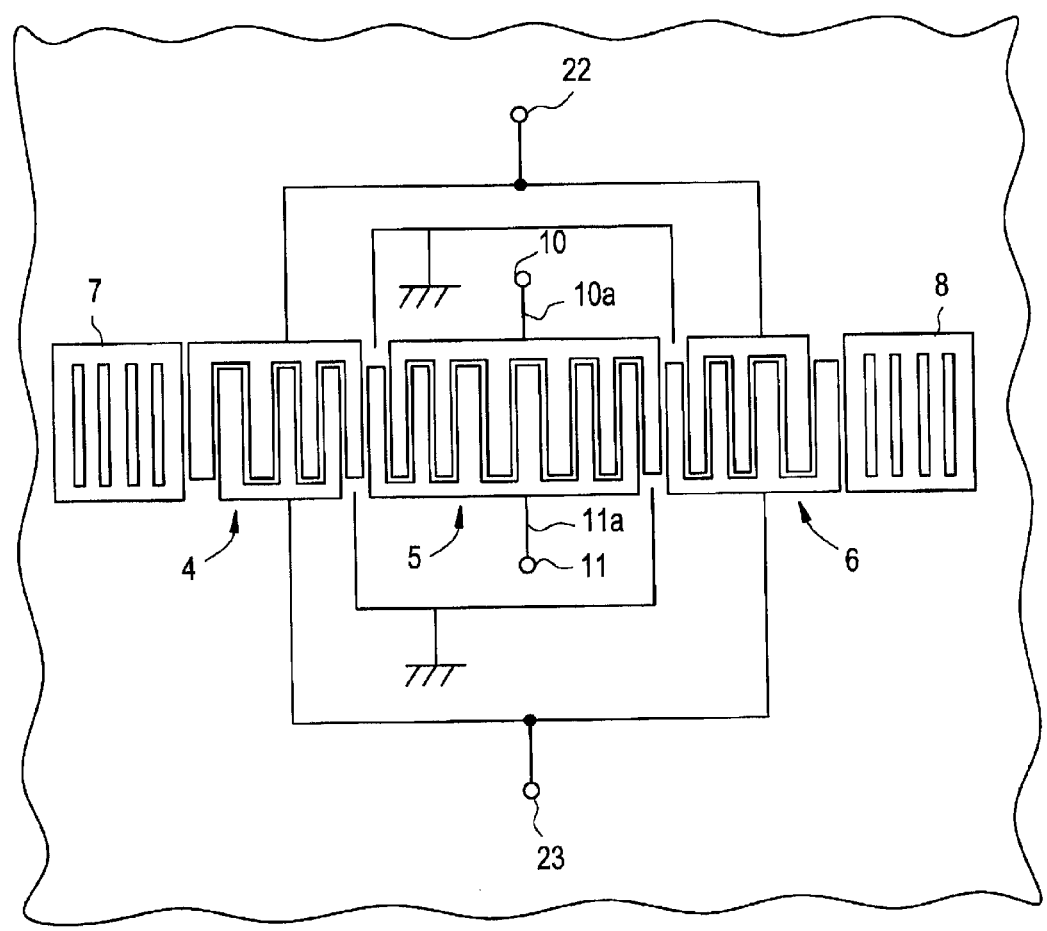
FIG. 13 is a schematic view of still another modification of the surface acoustic wave device according to the third preferred embodiment, which is effective in reducing bridging capacitances.

For example, the advantages described above can be also obtained in the following cases: the longitudinally-coupled resonator type surface acoustic wave device includes two or more IDTs; the surface acoustic wave resonators are coupled in parallel to each other; unbalanced signals are input (output) to the IDTs of the longitudinally-coupled type surface acoustic wave device from the opposite sides thereof, respectively, as shown in FIG. 11; two longitudinally-coupled resonator type surface acoustic wave units 1 are connected in two stages as shown in FIG. 12; and both of input signals and output signals are applied via terminals 10, 11, 22, and 23 for balanced-signals, as shown in FIG. 13.

Figure 14:
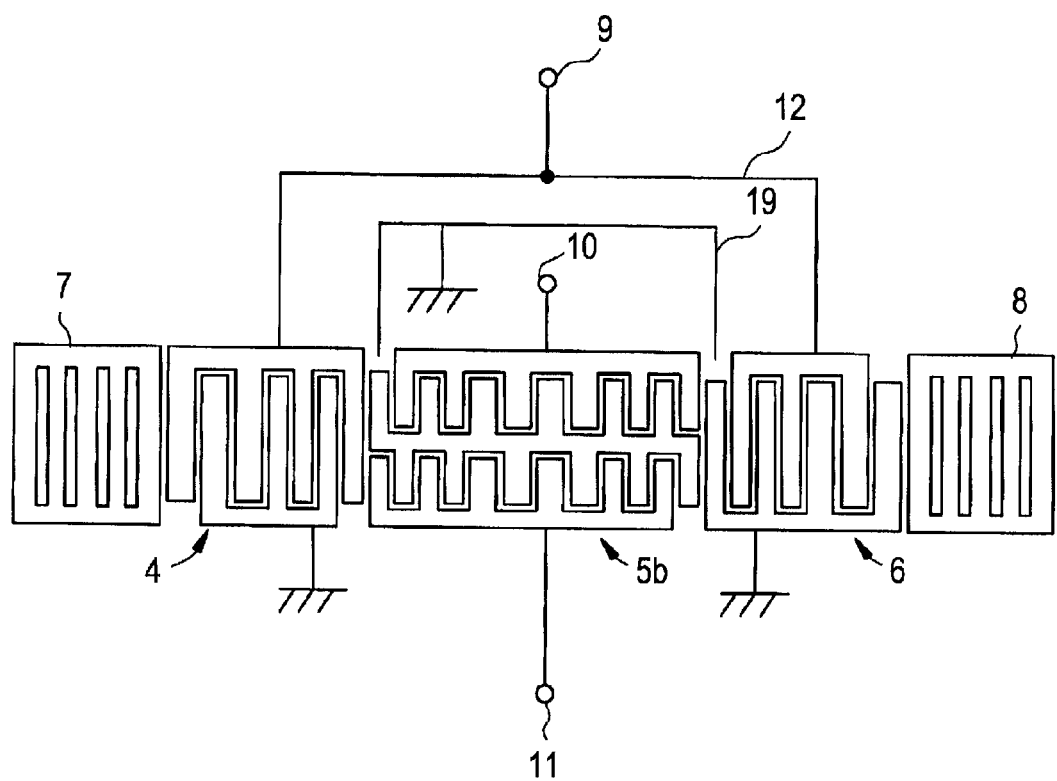
FIG. 14 is a schematic view of a surface acoustic wave device according to a fourth preferred embodiment of the present invention.
Figure 15:
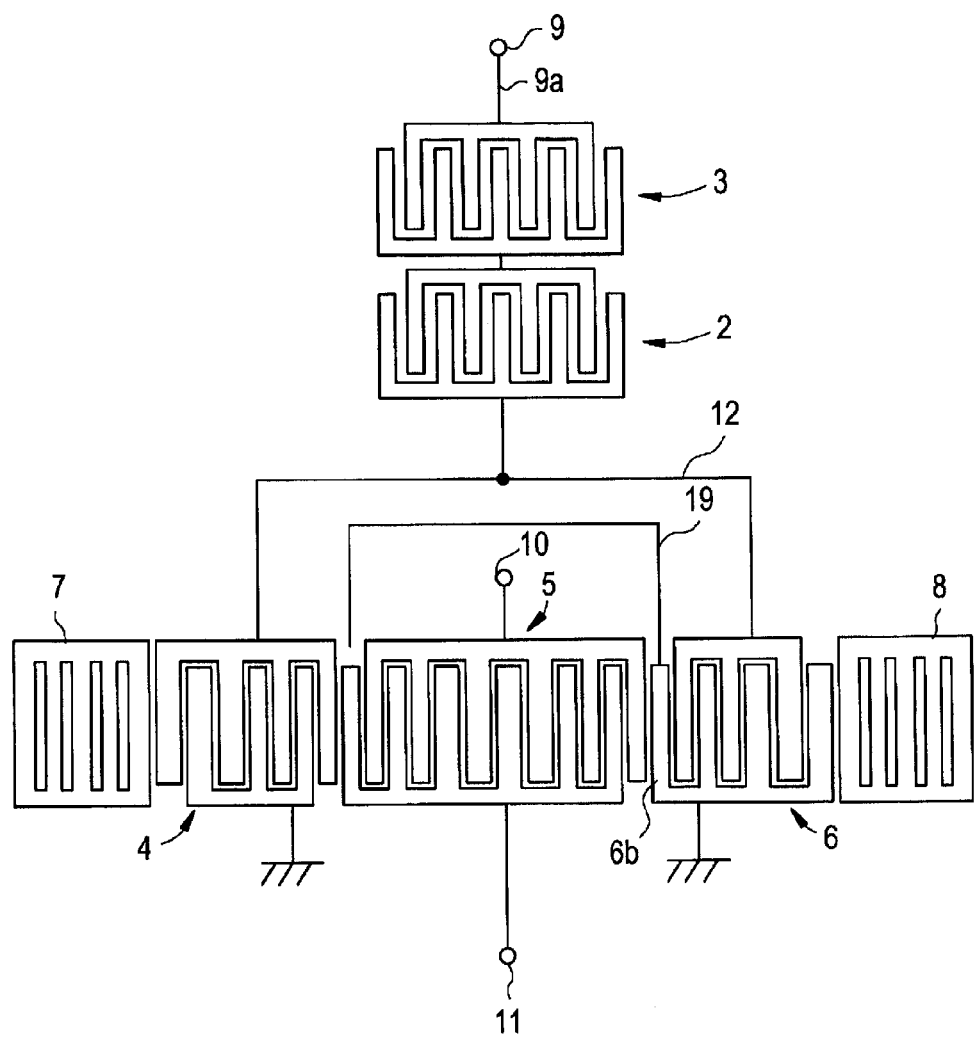
FIG. 15 is a schematic view of a fifth preferred embodiment of the present invention.

In a fourth preferred embodiment, an IDT 5b shown in FIG. 14 is provided instead of the IDT 5 shown in FIG. 10. The IDT 5 is formed by dividing the IDT 5 provided in the center of the longitudinally-coupled resonator type surface acoustic wave unit 1, as shown in FIG. 10, into two parts in the interdigitation-span direction. In the fourth preferred embodiment, the advantages of the present invention can be also obtained.

It should be noted that in the configurations of FIGS. 10 to 14, the elements having the same functions as those in the configuration of FIG. 1 are designated by the same reference numerals, and repetitious description is omitted. This is true of the other configurations which will be described later.

Moreover, surface acoustic wave devices having improved balance degrees between balanced signal terminals can be provided by reduction of a bridging capacitance, even if the devices have a configuration including an electrically neutral point between the balanced signal terminals, in addition to the case in which the configuration does not include an electrically neutral point between the balanced signal terminals 10 and 11 as described in the first to fourth preferred embodiments.

To ground the ground line 19 provided in the first and second preferred embodiments, it is desirable to use a method of connecting the ground line 19 to an electrode pad for wire bonding or bump bonding which is disposed on the piezoelectric substrate 20 to ground the IDTs 4 and 6.

However, in the configuration shown in FIG. 4, the above-described method can be achieved not only by forming the ground line 19 on the piezoelectric substrate 20. To ground the ground line 19, a new electrode pad is provided on the piezoelectric substrate 20.

In the fifth preferred embodiment, the ground line 19 is connected to the electrode finger 6b of the IDT 6 which is adjacent to the IDT 5 and is grounded. Thus, the ground line 19 can be connected to the ground (or grounded), not using a new electrode pad. In this configuration and the method, a new electrode pad does not need to be provided on the piezoelectric substrate 20. Consequently, this is effective in reducing the size of the surface acoustic wave device.

Hereinafter, a surface acoustic wave device according to a sixth preferred embodiment of the present invention will be described with reference to FIG. 16. The configuration of the surface acoustic wave device according to the sixth preferred embodiment is preferably the same as that of the above-described first preferred embodiment except that the ground line 19 in the first preferred embodiment is omitted, and a new configuration described below is added. Accordingly, in the sixth preferred embodiment, the members of the configuration thereof excluding the new one are designated by the same reference numerals as those in the first preferred embodiment, and repetitive description is omitted.

In the sixth preferred embodiment, as the new configuration, the bus bars 34a and 36a of IDTs 34 and 36 connected to the signal line 12, and the bus bar 35a of an IDT 35 are provided with bus bar narrow portions 34b, 35b, 35c, and 36b, respectively. The bus bar narrow portions 34b, 35b, 35c, and 36b are arranged such that the widths are preferably smaller (thinner) than the ordinary widths of the bus bars 34a, 35a, and 36a, the intervals between the opposing portions the bus bars 34a, 35a, and 36a are increased, and the opposing portions thereof are reduced, respectively.

Therefore, the widths of the bus bar narrow portions 34b, 35b, 35c, and 36b are preferably smaller (thinner) than those of the bus bars 34a, 35a, and 36a in the sites thereof in which they are opposed to each other and their vicinities.

Thus, the bus bar narrow portion 34b is disposed in the corner of the bus bar 34a which is adjacent to the bus bar 35a. The bus bar narrow portions 35b and 35c are adjacent to the bus bars 34a and 36a, respectively. The bus bar narrow portion 36b is disposed in the corner of the bus bar 36a which is adjacent to the bus bar 35a.

The configurations and the functions of the IDTs 34, 35, and 36 are preferably substantially the same as those of the IDTs 4, 5, and 6 shown in FIG. 1 except for the bus bar narrow portions 34b, 35b, 35c, and 36b.

In the sixth preferred embodiment, the bus bar narrow portions 34b, 35b, 35c, and 36b are provided, which are formed by thinning the adjacent portions of the bus bars 34a, 35a, and 36a on the side of the IDTs in which they are connected to the signal line 12. Accordingly, this is effective in reducing the bridging capacitances similarly to the first preferred embodiment. Thus, in the sixth preferred embodiment, the balance degrees between the balanced signal terminals 10 and 11 are greatly improved, and moreover, the attenuation occurring out of the transmission band is greatly improved, similarly to the first preferred embodiment.

Figure 16:
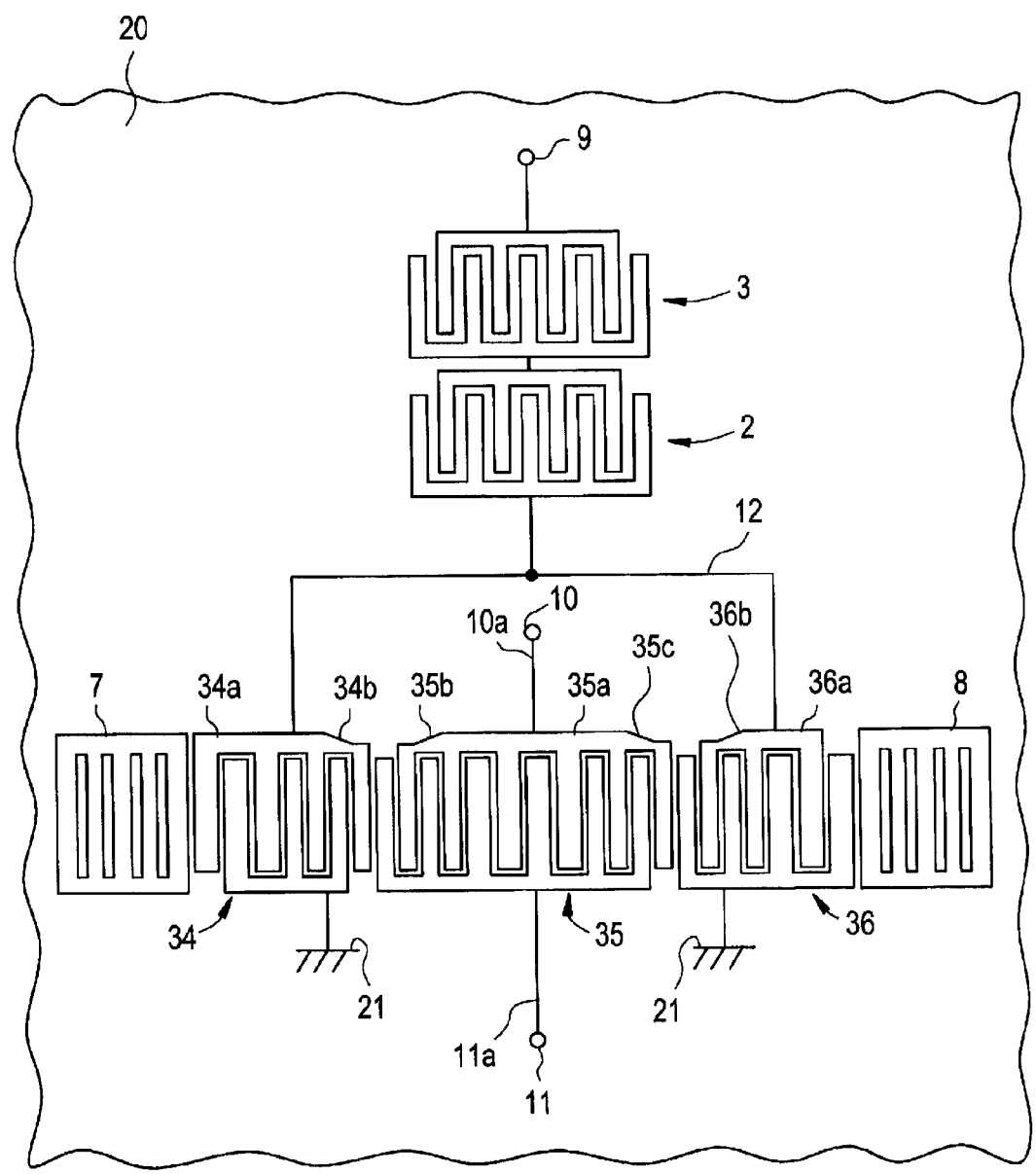
FIG. 16 is a schematic view of a surface acoustic wave device according to a sixth preferred embodiment of the present invention.

However, in the case in which the bus bar narrow portions 34b, 35b, 35c, and 36b having reduced widths as shown in FIG. 16 are provided, pyroelectrically breaking may occur, which causes the bus bars 34a, 35a, and 36a to break.

Figure 17:
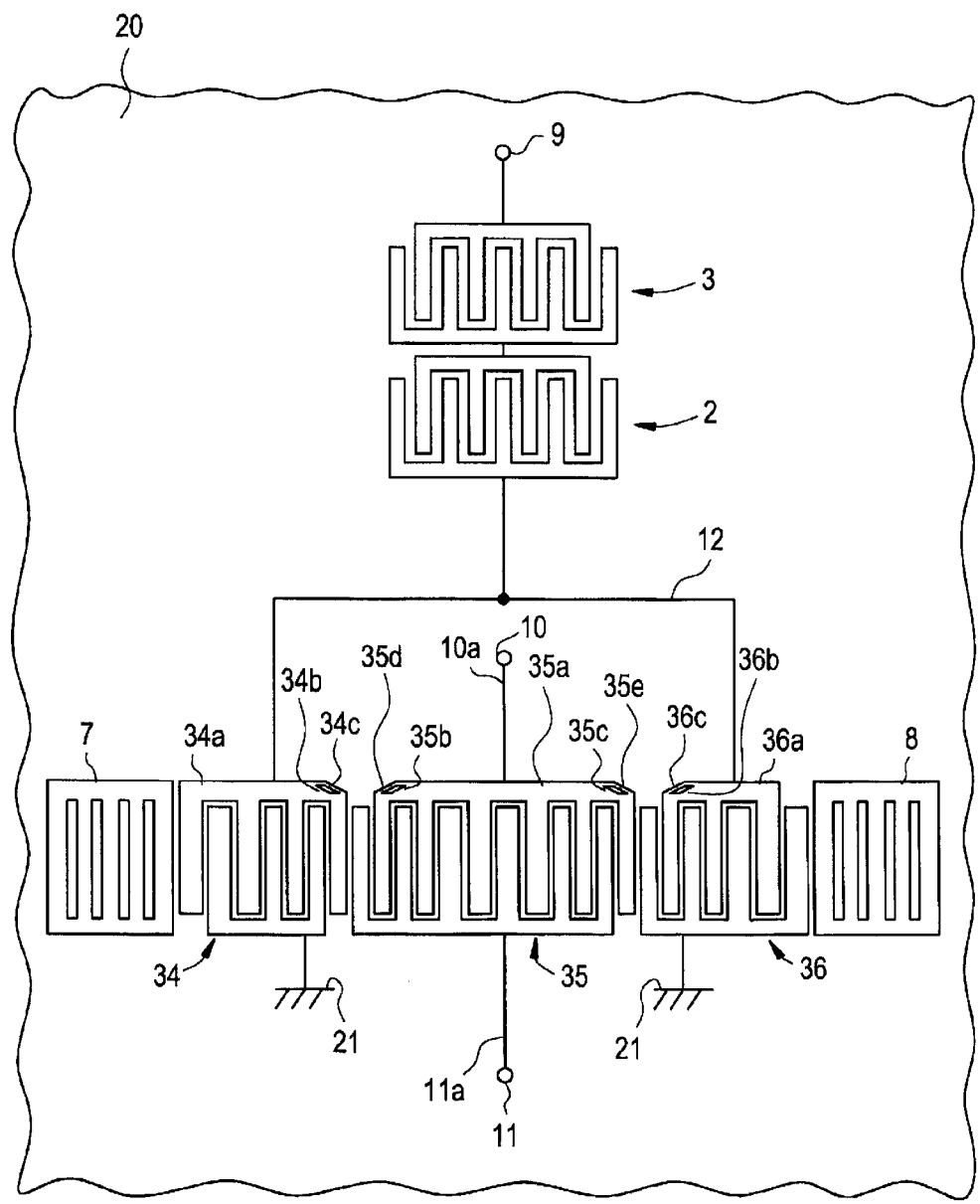
FIG. 17 is a schematic view of a modification of the surface acoustic wave device according to preferred embodiments of the present invention.
Figure 18:
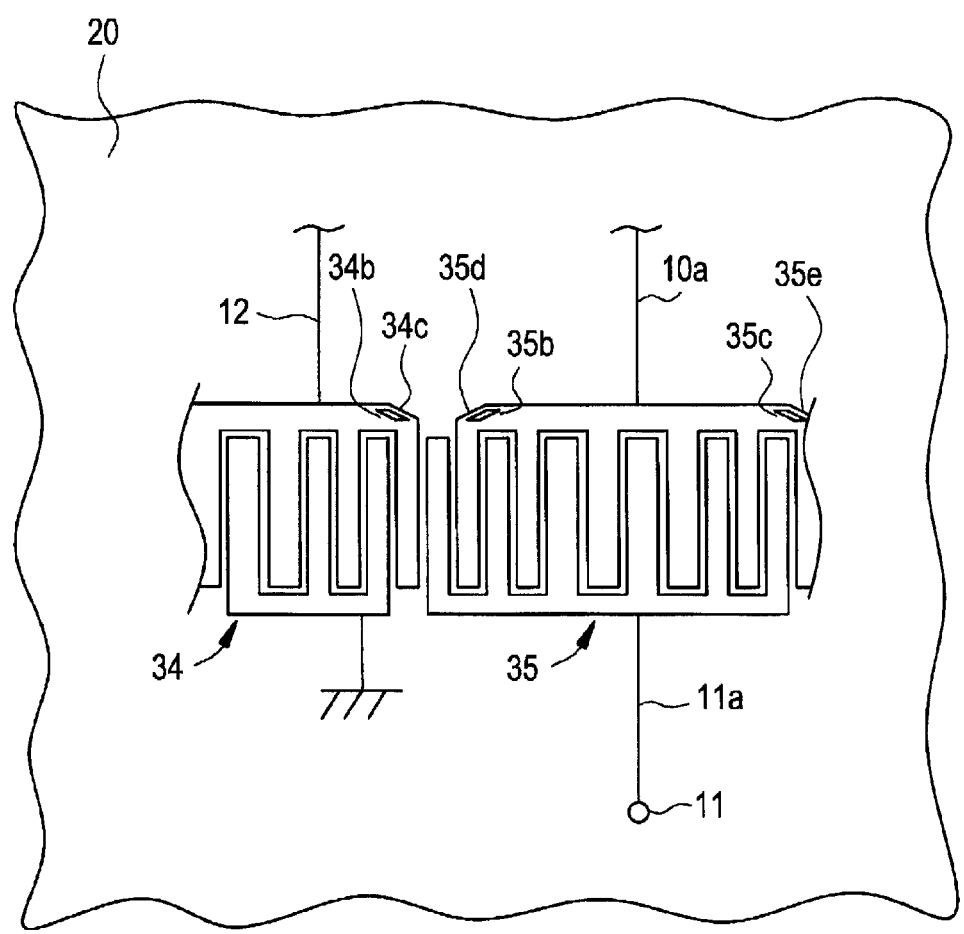
FIG. 18 is an enlarged view of an essential portion of the surface acoustic wave device of the FIG. 17.

In order to prevent the above-described breaking, thin bridging lines 34c, 35d, 35e, and 36c may be provided in the bus bar narrow portions 34b, 35b 35c, and 36b as shown in FIGS. 17 and 18, in the number of one per bus bar narrow portion. Thus, even if one line is pyroelectrically broken, the electrical connection can be maintained, and the effects on reduction of the bridging capacitance can be maintained.

The advantages of the present invention can be obtained for the longitudinally-coupled resonator type surface acoustic wave devices according to the first to sixth preferred embodiments, and also, similar advantages can be obtained for transversely-coupled resonator type surface acoustic wave devices and transversal type surface acoustic wave devices each including balanced-signal terminals by appropriately setting the ground line 19 and the electrode fingers 24a, 24b, and 26a.

In the first to sixth preferred embodiments, the piezoelectric substrate 20 made of 40±5° Y cut X propagation LiTaO₃ is preferably used. As seen in the principles of the present invention in which the advantages can be obtained, the present invention is not limited to the piezoelectric substrate 20. The same advantages can be also obtained when other piezoelectric substrates made of 64 to 72° Y cut X propagation LiNbO₃ and 41° Y cut X propagation LiNbO₃ are used. Other suitable material for the piezoelectric substrate may also be used.

The first to sixth preferred embodiments individually having unique features are described by way of examples. Any combination of these preferred embodiments is possible, and the above-described advantages can be further improved by the combination thereof.

The configurations for decreasing the bridging capacitances described in the first to sixth preferred embodiments are not restrictive. For example, a package structure of the related art may be changed to that of which bridging capacitances can be reduced, or bus bars connected to signal lines may be made more distant from each other, that is, the interval between them may be increased by insertion of several ground electrodes, that is, short reflectors into the sites in which the two IDTs are adjacent to each other. In these cases, the advantages of the present invention can be obtained.

Figure 19:
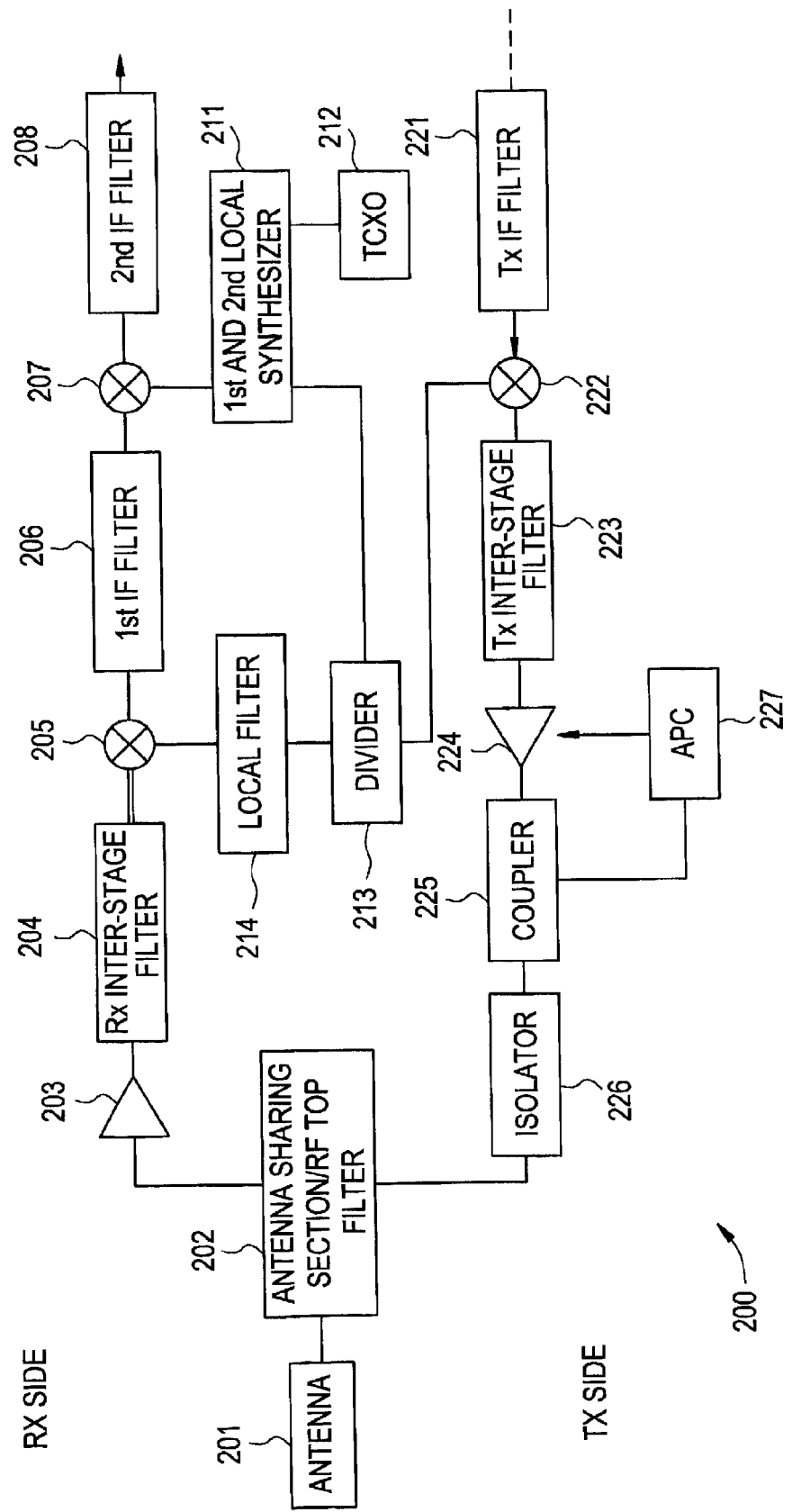
FIG. 19 is a block diagram showing the essential units of a communication device including the surface acoustic wave device according to various preferred embodiments of the present invention.
Figure 20:
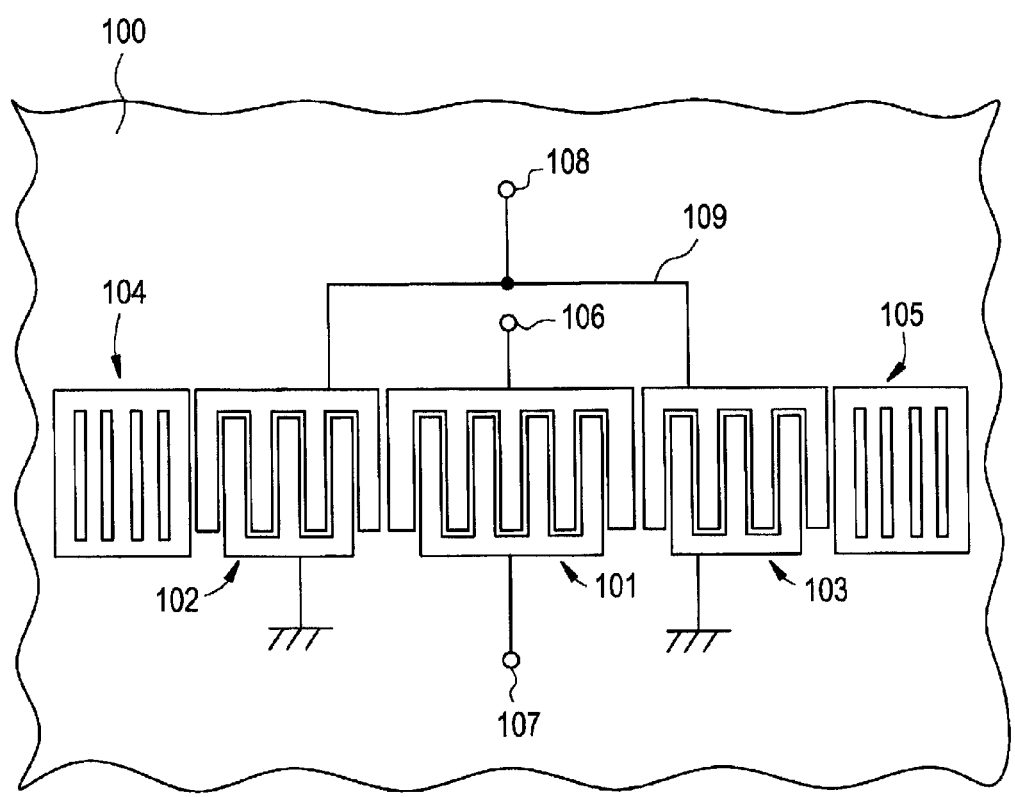
FIG. 20 is a schematic view of the configuration of a surface acoustic wave device of the related art.
Figure 21:
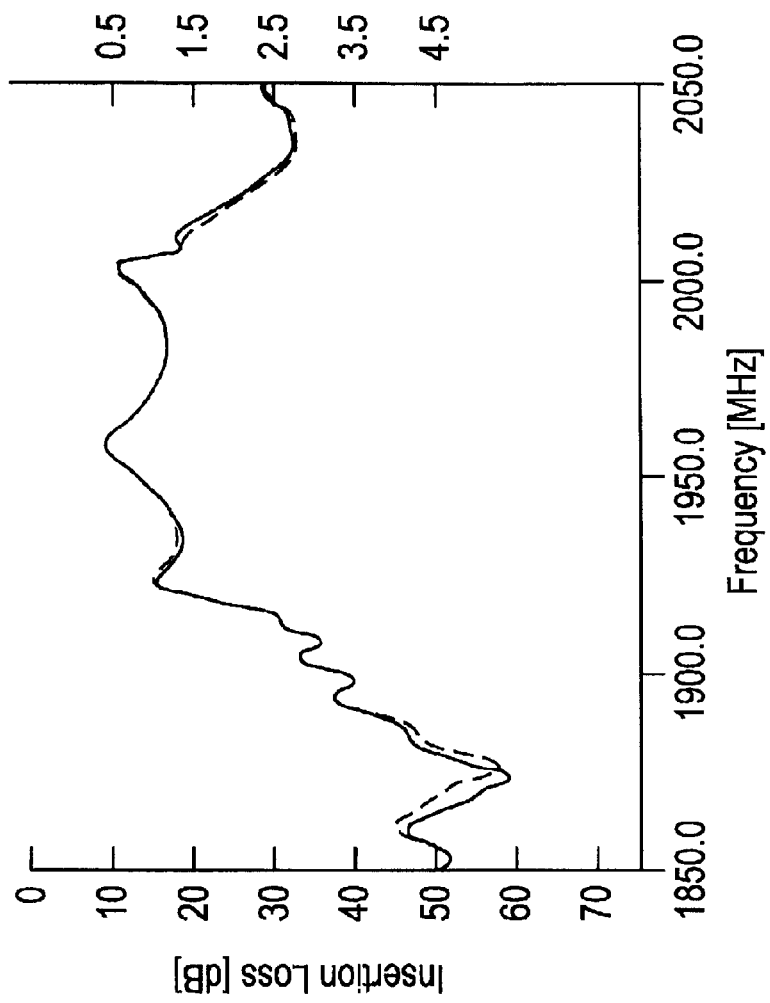
FIG. 21 is a graph (simulation) showing changes in resonant mode of the related art surface acoustic wave device when the bridging capacitance is small.
Figure 22:
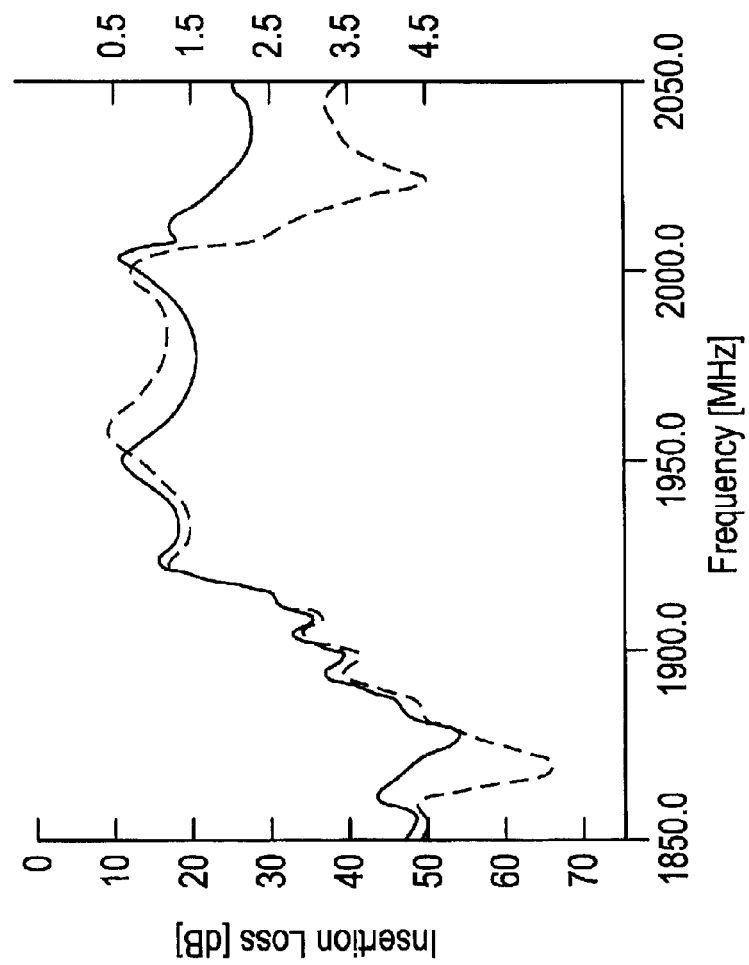
FIG. 22 is a graph (simulation) showing changes in resonant mode of the related art surface acoustic wave device when the bridging capacitance is large.

Hereinafter, a communication device including the surface acoustic wave device of any one of the various preferred embodiments of the present invention will be described with reference to FIG. 19. As shown in FIG. 19, a communication device 200 preferably includes, on the receiver side (Rx side) in which reception is carried out, an antenna 201, an antenna sharing section/RF Top filter 202, an amplifier 203, an Rx inter-stage filter 204, a mixer 205, a Ist IF filter 206, a mixer 207, a 2nd IF filter 208, a 1st and 2nd local synthesizer 211, a TCXO (temperature compensated crystal oscillator) 212, a divider 213, and a local filter 214. Preferably, to assure the balance characteristic, transmission from the Rx inter-stage filter 204 to the mixer 205 is carried out by using balanced signals, as illustrated by the two lines in FIG. 19.

Moreover, the communication device 200 preferably includes, on the transceiver side (Tx side) in which transmission is carried out, the antenna 201 and the antenna sharing section/the RF Top filter 202 which are shared, a TXIF filter 221, a mixer 222, a Tx inter-stage filter 223, an amplifier 224, a coupler 225, an isolator 226, and an APC (automatic power control) 227.

Any one of the surface acoustic wave devices of the first to sixth preferred embodiments described above can be suitably used as the aforementioned Rx inter-stage filter 204.

As described above, the surface acoustic wave device according to various preferred embodiments of the present invention includes terminals for signals containing terminals for balanced-signals and signal lines via which the signal terminals and IDTs are connected to each other, provided on the piezoelectric substrate, and a ground line provided between a signal terminal and an adjacent signal line on the piezoelectric substrate.

Thus, in the above-described configuration, since the ground line is provided, advantageously, a bridging capacitance generated between a signal terminal and the adjacent signal line is minimized, and thus, the signal propagation characteristics of the device at the signal terminals can be improved.

In addition, in the above-described configuration, since the signal propagation characteristics of the device at the signal terminals can be improved, advantageously, the attenuation occurring out of the transmission band can be more increased.

As described above, in the surface acoustic wave device according to various preferred embodiments of the present invention, a ground electrode finger is provided in the outermost portion of at least one of two adjacent IDTs which is opposed to that of the other interdigital electrode, in such a manner that the tip of the ground electrode finger further extends in the interdigitation-span direction compared to the other electrode fingers of the interdigital electrode.

Therefore, in the above-described configuration, since the ground electrode finger is provided, a bridging capacitance generated between the two adjacent IDTs can be reduced. Thus, the signal propagation characteristics of the device at the signal terminals are greatly improved.

As described above, in the surface acoustic wave device according to other preferred embodiments of the present invention, the IDT connected to a signal line and an adjacent IDT are arranged in such a manner that the widths of the bus bars of the IDTs are reduced with the opposing portions of the bus bars being reduced in size.

Thus, since the widths of the bus bars of the IDTs in the opposing portions thereof are decreased, a bridging capacitance generated between the IDTs is minimized. Thus, advantageously, the signal propagation characteristics of the device at the signal terminals are greatly improved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a piezoelectric substrate;
   a plurality of interdigital electrodes for converting an input signal to a surface acoustic wave to be output, the plurality at interdigital electrodes being-arranged on the piezoelectric substrate in a surface acoustic wave propagation direction;
   a plurality of terminals provided on the piezoelectric substrate and arranged to transmit signals, including signal terminals for transmitting balanced-signals;
   a plurality of signal lines provided on the piezoelectric substrate and arranged to connect the signal terminals and the interdigital electrodes to each other; and
   a ground line provided on the piezoelectric substrate between one of the plurality of signal terminals and an adjacent one of the plurality of signal lines.

2. A surface acoustic wave device according to claim 1, wherein the ground line is arranged to surround one of the plurality of signal lines that has a pad shape.

3. A surface acoustic wave device according to claim 1, wherein a surface acoustic wave resonator is connected to one of the interdigital electrodes and is disposed on the piezoelectric substrate.

4. A surface acoustic wave device according to claim 1, wherein the device has a balance-unbalance conversion function.

5. A surface acoustic wave device according to claim 1, wherein the number of electrode ringers of the interdigital electrode connected to the signal terminals for transmitting balanced signals is even.

6. A communication device comprising at least one surface acoustic wave device according to claim 1.

7. A surface acoustic wave device comprising:

a piezoelectric substrate;

a plurality of interdigital electrodes for converting an input signal to a surface acoustic wave to be output, the plurality of interdigital electrodes being arranged on the piezoelectric substrate in a surface acoustic wave propagation direction;

a plurality of terminals provided on the piezoelectric substrate and arranged to transmit signals, including signal terminals for transmitting balanced-signals;

a plurality of signal lines provided on the piezoelectric substrate and arranged to connect the signal terminals and the interdigital electrodes to each other; and a ground electrode finger provided in an outermost portion of at least one of two adjacent interdigital electrodes which is opposed to that of the other of the two adjacent interdigital electrodes in such a manner that a tip of a ground electrode finger extends further in the interdigitation-span direction compared to the other electrode fingers of the one of two adjacent interdigital electrodes.

8. A surface acoustic wave device according to claim 7, wherein a surface acoustic wave resonator is connected to one of the interdigital electrodes and is disposed on the piezoelectric substrate.

9. A surface acoustic wave device according to claim 7, wherein the device has a balance-unbalance conversion function.

10. A surface acoustic wave device according to claim 7, wherein the number of electrode fingers of the interdigital electrode connected to the signal terminals for transmitting balanced signals is even.

11. A communication device comprising at least one surface acoustic wave device according to claim 7.

12. A surface acoustic wave device comprising:

a piezoelectric substrate;

a plurality of interdigital transducers for converting an input signal to a surface acoustic wave to be output, the plurality of interdigital transducers being arranged on the piezoelectric substrate in a surface acoustic wave propagation direction;

a plurality of terminals provided on the piezoelectric substrate and arranged to transmit signals, including signal terminals for transmitting balanced-signals;

a plurality of signal lines provided on the piezoelectric substrate and arranged to connect the signal terminals and the plurality of interdigital transducers to each other; and a first of the plurality of interdigital transducers that is connected to one of the plurality of signal lines and a second of the plurality of interdigital transducers that is adjacent to the first of the plurality of interdigital transducers being formed in such a manner that the widths of bus bars of the first and second of the plurality of interdigital transducers are decreased such that opposing portions of the first and second IDTs are reduced in size as compared to the remaining ones of the plurality of interdigital transducers.

13. A surface acoustic wave device according to claim 12, wherein a surface acoustic wave resonator is connected to one of the plurality of interdigital transducers and is disposed on the piezoelectric substrate.

14. A surface acoustic wave device according to claim 12, wherein the device has a balance-unbalance conversion function.

15. A surface acoustic wave device according to claim 12, wherein the number of electrode fingers of the interdigital transducer connected to the signal terminals for transmitting balanced signals is even.

16. A communication device comprising at least one surface acoustic wave device according to claim 12.

17. A surface acoustic wave device comprising:

a piezoelectric substrate;

a plurality of interdigital electrodes for converting an input signal to a surface acoustic wave to be output, the plurality of interdigital electrodes being arranged on the piezoelectric substrate in a surface acoustic wave propagation direction;

a plurality of terminals arranged on the piezoelectric substrate to transmit signals including two signal terminals for transmitting balanced-signals and one terminal for transmitting an unbalanced-signal;

a signal line arranged on the piezoelectric substrate so as to connect said one terminal for transmitting an unbalanced-signal and the interdigital electrodes to each other; and a ground line arranged on the piezoelectric substrate between at least one of the two terminals for transmitting balanced-signals and the signal line that is adjacent thereto.

18. A surface acoustic wave device according to claim 17, wherein a surface acoustic wave resonator is connected to one of the interdigital electrodes and is disposed on the piezoelectric substrate.

19. A surface acoustic wave device according to claim 17, wherein the device has a balance-unbalance conversion function.

20. A surface acoustic wave device according to claim 17, wherein the number of electrode fingers of the interdigital electrode connected to the two signal terminals for transmitting balanced signals is even.

21. A communication device comprising at least one surface acoustic wave device according to claim 17.

* * * * *